United States Patent [19]
Tanabe et al.

[11] Patent Number: 5,577,199
[45] Date of Patent: Nov. 19, 1996

[54] MAJORITY CIRCUIT, A CONTROLLER AND A MAJORITY LSI

[75] Inventors: Takashi Tanabe; Toshihisa Kamemaru; Mamoru Katoh; Tsugihiko Ohno; Toyohito Hatashita; Kaoru Abe, all of Kanagawa, Japan

[73] Assignee: Mitsubishi Denki Kabushiki Kaisha, Tokyo, Japan

[21] Appl. No.: 243,362

[22] Filed: May 16, 1994

[30] Foreign Application Priority Data

Jun. 1, 1993 [JP] Japan ................................. 5-130724

[51] Int. Cl.⁶ ............................................. G06F 11/00
[52] U.S. Cl. ................. 395/183.13; 395/185.02
[58] Field of Search ........................... 395/575, 183.13, 395/185.02, 185.05; 371/36, 68.1, 67.1

[56] References Cited

U.S. PATENT DOCUMENTS

| | | | |
|---|---|---|---|
| 4,709,376 | 11/1987 | Kage | 371/36 |
| 4,761,782 | 8/1988 | Lin | 371/36 |
| 4,799,140 | 1/1989 | Dietz et al. | 371/36 |
| 4,967,347 | 10/1990 | Smith et al. | 364/200 |
| 5,241,548 | 8/1993 | Dillon et al. | 371/36 |
| 5,269,016 | 12/1993 | Butler et al. | 395/575 |
| 5,271,023 | 12/1993 | Norman | 371/68.3 |
| 5,339,404 | 8/1994 | Vandling, III | 371/36 |
| 5,382,950 | 1/1995 | Gronemeyer | 371/36 |
| 5,394,409 | 2/1995 | Barthel et al. | 371/36 |

FOREIGN PATENT DOCUMENTS

| | | | |
|---|---|---|---|
| 0082533 | 6/1983 | European Pat. Off. | G06F 11/18 |
| 0381334 | 8/1990 | European Pat. Off. | G06F 11/18 |
| 0514075 | 11/1992 | European Pat. Off. | G06F 11/18 |
| 0527667 | 2/1993 | European Pat. Off. | G05B 9/03 |
| 3-46851 | 7/1988 | Japan | G06F 11/18 |
| 1-126825 | 5/1989 | Japan | H03K 19/23 |
| 3-26415 | 2/1991 | Japan | B23G 1/02 |

Primary Examiner—Robert W. Beausoliel, Jr.
Assistant Examiner—Joseph E. Palys
Attorney, Agent, or Firm—Wolf, Greenfield & Sacks, P.C.

[57] ABSTRACT

This invention provides a majority circuit, connecting a plurality of processing units. The majority circuit can detect a single error or multiple errors, and sets the majority output signal to an ineffective level when multiple errors are detected. The majority circuit includes comparators, each comparing two outputs of three processing units, and the error detector recognizes the error status and outputs the single error signal and the multiple error signal accordingly. The majority circuit also includes a selector, which selects the output of a normal processing unit, when the normal processing unit can be specified based on the comparison result. The selector changes the output to a predetermined level, when the normal processing unit cannot be specified.

16 Claims, 31 Drawing Sheets

EMBODIMENT 3 OF THE INVENTION

COMPARATOR 41

ERROR DETECTOR 8

SELECTOR 6

FIG.5

TABLE FOR EXPLAINING EMBODIMENT 1

| LIN. | A 31 | B 32 | C 33 | AB 51 | BC 52 | CA 53 | V 7 | ES 9 | EM 10 |
|---|---|---|---|---|---|---|---|---|---|
| ① | 0 0 | 0 0 | 0 0 | 1 | 1 | 1 | 0 0 | 0 | 0 |
| ② | 1 0 | 1 0 | 1 0 | 1 | 1 | 1 | 1 0 | 0 | 0 |
| ③ | 1 0 | 0 1 | 0 1 | 0 | 1 | 0 | 0 1 | 1 | 0 |
| ④ | 1 0 | 0 1 | 0 0 | 0 | 0 | 0 | 0 0 | 0 | 1 |
| ⑤ | 0 1 | 1 0 | 1 1 | 0 | 0 | 0 | 0 0 | 0 | 1 |
| ⑥ | 1 1 | 1 1 | 1 0 | 1 | 0 | 0 | 1 1 | 1 | 0 |
| ⑦ | 1 1 | 0 1 | 1 0 | 0 | 0 | 0 | 0 0 | 0 | 1 |

SELECTOR6 IN EMBODIMENT 2 OF THE INVENTION

FIG.7

TABLE FOR EXPLAINING EMBODIMENT 2

| LIN. | A (31) | B (32) | C (33) | AB (51) | BC (52) | CA (53) | V (7) | ES (9) | EM (10) |
|---|---|---|---|---|---|---|---|---|---|
| ① | 0 0 | 0 0 | 0 0 | 1 | 1 | 1 | 0 0 | 0 | 0 |
| ② | 1 0 | 1 0 | 1 0 | 1 | 1 | 1 | 1 0 | 0 | 0 |
| ③ | 1 0 | 0 1 | 0 1 | 0 | 1 | 0 | 0 1 | 1 | 0 |
| ④ | 1 0 | 0 1 | 0 0 | 0 | 0 | 0 | 1 0 | 0 | 1 |
| ⑤ | 0 1 | 1 0 | 1 1 | 0 | 0 | 0 | 1 0 | 0 | 1 |
| ⑥ | 1 1 | 1 1 | 1 0 | 1 | 0 | 0 | 1 1 | 1 | 0 |
| ⑦ | 1 1 | 0 1 | 1 0 | 0 | 0 | 0 | 1 0 | 0 | 1 |

ERROR DETECTOR 8a

WINDOW CIRCUIT 11

FIG. 11 TIMING CHART FOR EXPLAINING EMBODIMENT 3

FIG.12

TABLE FOR EXPLAINING EMBODIMENT 3

| LIN. | ADDR/<br>DATA#A | ADDR/<br>DATA#B | ADDR/<br>DATA#C | AS<br>#A | DS<br>#A | AS<br>#B | DS<br>#B | AS<br>#C | DS<br>#C | AB | BC | CA | EC | ES | EM |
|---|---|---|---|---|---|---|---|---|---|---|---|---|---|---|---|
| ① | 0 0 | 0 0 | 0 0 | 1 | 0 | 1 | 0 | 1 | 0 | 1 | 1 | 1 | 1 | 0 | 0 |
| ② | Z Z | Z Z | Z Z | 0 | 0 | 0 | 0 | 0 | 0 | X | X | X | 0 | 0 | 0 |
| ③ | 0 1 | 0 1 | 0 1 | 0 | 1 | 0 | 1 | 0 | 0 | 1 | 0 | 0 | 1 | 1 | 0 |
| ④ | Z Z | Z Z | Z Z | 0 | 0 | 0 | 0 | 0 | 0 | X | X | X | 0 | 0 | 0 |
| ⑤ | 0 0 | 1 0 | 1 0 | 1 | 0 | 0 | 0 | 1 | 0 | 0 | 0 | 0 | 1 | 0 | 1 |
| ⑥ | Z Z | Z Z | Z Z | 0 | 0 | 0 | 0 | 0 | 0 | X | X | X | 0 | 0 | 0 |
| ⑦ | 1 1 | 0 1 | 1 1 | 0 | 1 | 0 | 1 | 0 | 1 | 0 | 1 | 0 | 1 | 1 | 0 |

EMBODIMENT 4 OF THE INVENTION

SELECTOR 6A

FIG.16

TABLE FOR EXPLAINING EMBODIMENT 4

| LIN. | AB#1 (21-1) | BC#1 (21-2) | CA#1 (21-3) | AB#2 (22-1) | BC#2 (22-2) | CA#2 (22-3) | V#1 | V#2 | ERR. LOCATION |
|---|---|---|---|---|---|---|---|---|---|
| ① | 1 | 1 | 1 | 1 | 1 | 1 | CPU#A | CPU#A | NORMAL |
| ② | 1 | 1 | 0 | 0 | 1 | 0 | CPU#B | CPU#B | CPU#A & COMP. AB#1 |
| ③ | 1 | 0 | 0 | 1 | 1 | 0 | CPU#A | CPU#A | CPU#C & COMP. BC#2 |
| ④ | 0 | 1 | 0 | 1 | 1 | 0 | CPU#B | CPU#B | CPU#A & COMP. AB#2 |

EMBODIMENT 5 OF THE INVENTION

FIG.19

ERROR DETECTION IN EMBODIMENT 5

| LIN. | AB #11 | AB #12 | BC #11 | BC #12 | CA #11 | CA #12 | AB #2 | BC #2 | CA #2 | ERR. LOCATION |
|---|---|---|---|---|---|---|---|---|---|---|
| ① | 1 | 1 | 1 | 1 | 1 | 1 | 1 | 1 | 1 | NORMAL |
| ② | 0 | 0 | 1 | 1 | 0 | 0 | 0 | 1 | 0 | CPU#A |
| ③ | 0 | 0 | 1 | 1 | 0 | 0 | 1 | 1 | 1 | RCV. A#1 |
| ④ | 1 | 1 | 0 | 0 | 1 | 0 | 1 | 0 | 0 | CPU#C, COMP. CA#12 |

51-1, 51-2, 52-1, 52-2, 53-1, 53-2, 22-1, 22-2, 22-3

MASK CIRCUIT 54

FIG. 22 EMBODIMENT 7 OF THE INVENTION

EMBODIMENT 8 OF THE INVENTION

EMBODIMENT 9 OF THE INVENTION

FIG. 25 EMBODIMENT 10 OF THE INVENTION

FIG.26 PRACTICAL APPLICATION OF EMBODIMENT 10

CONVENTIONAL HIGHLY RELIABLE MAJORITY CIRCUIT

CONVENTIONAL MAJORITY CIRCUIT 200

FIG.29 (RELATED ART)

TABLE FOR EXPLAINING
A CONVENTIONAL MAJORITY CIR

| LIN. | A2, A1 | | B2, B1 | | C2, C1 | | V2, V1 | |
|---|---|---|---|---|---|---|---|---|
| ① | 0 | 0 | 0 | 0 | 0 | 0 | 0 | 0 |
| ② | 1 | 0 | 1 | 0 | 1 | 0 | 1 | 0 |
| ③ | 1 | 0 | 0 | 1 | 0 | 1 | 0 | 1 |
| ④ | 1 | 0 | 0 | 1 | 0 | 0 | 0 | 0 |
| ⑤ | 0 | 1 | 1 | 0 | 1 | 1 | 1 | 1 |
| ⑥ | 1 | 1 | 1 | 1 | 1 | 0 | 1 | 1 |
| ⑦ | 1 | 1 | 0 | 1 | 1 | 0 | 1 | 1 |

PRACTICAL APPLICATION OF THE CONVENTIONAL MAJORITY CIR.

CONVENTIONAL DUPLICATED MAJORITY CIR.

ERROR CORRECTION OF THE CONVENTIONAL MAJORITY CIR.

FIG. 33 (RELATED ART)

TABLE FOR EXPLAINING CONVENTIONAL ERROR AVOIDANCE

| CASE | FAULTY ELM. | ELM. FOR AVOIDING ERROR |
|---|---|---|
| ① | CPU | AVOIDING BY MAJORITY CIR |
| ② | ECC ENC | AVOIDING BY MAJORITY CIR |
| ③ | MAJORITY CIR. | AVOIDING BY ECC DECODER |
| ④ | ECC DEC | AVOIDING BY ANOTHER REDUNDANCY CHECK |

ERROR DETECTION OF THE CONVENTIONAL MAJORITY CIR.

MAJORITY CIRCUIT, A CONTROLLER AND A MAJORITY LSI

BACKGROUND OF THE INVENTION

1. Field of the Invention

This invention relates to a majority circuit in a highly reliable multiplexed computer. It relates specially to a majority circuit for selecting an output of a normal processing unit from more than three processing units which execute the same instruction simultaneously.

2. Description of the Related Art

Various techniques are used to improve reliability of computers in the field of fault-tolerant computing. One of the most popular techniques is multiplexing a circuit which provides a critical logical function (Usually, a processing unit). Generally, a plurality of outputs from the multiplexed processing units are input to a majority circuit, and the majority circuit selects one output as a majority result. A typical example of the majority circuit is "two out of three majority method" which selects one of at least two equal outputs from three outputs of triplicated processing units. According to this method, the correct output is obtained by the majority circuit even when an error occurs in one of three processing units. But when errors occur in two of the three processing units or in the majority circuit itself, the normal output cannot be obtained, and this may cause the whole system to go down.

An example of a conventional technique that detects an error of the majority circuit, is described in Japanese Examined Patent No. HEI 3-26415 bulletin as shown in FIG. 27. Majority circuit 200 detects the majority signal of input signals 31–33 in this method. Inside of a self-diagnostic circuit 4, there is another majority circuit, which is similar to the majority circuit 200. An output signal 7 of the majority circuit 200 and a majority result of the self-diagnostic circuit 4 are compared. When these two majority results do not match, the majority circuit is judged to be faulty. When each input signal 31–33 has 2 bits, the majority circuit 200 is configured as shown in FIG. 28. This majority circuit 200 carries out logical operations, bit-by-bit, and obtains output signals as shown in FIG. 29. But, by this method, even when the input signals 31–33 are different as shown in the fourth line, the fifth line, and the seventh line of FIG. 29, the output signal 7 of the majority circuit 200 becomes equal to the majority result of the self-diagnostic circuit 4. In other words, the output signal 7 of the majority circuit 200 becomes effective even when two of the processing units are faulty. Thus, a wrong signal may be provided to the circuit of the next stage of the majority circuit 200.

Usual output of the processing unit includes an address signal, a data signal, and a control signal. A status of the address signal or the data signal may float (for example, high impedance) at a certain timing point. Accordingly, if mismatch detection and error detection is carried out at any timing point to detect faults, improper fault detection may result. To avoid improper fault detection, mismatch detection is carried out only when a mismatch is detected and continued for a certain period by a masking time setter 5 as shown in FIG. 27. The period of the floating state varies according to the operating status of the processing unit, so that the masking time becomes long when the period of the floating state is long. On the other hand, a period to be checked is also masked by the long masking time and the reliability of the processing unit is reduced. In this way, using the masking time setter 5 cannot solve the problem completely. And in this method, a redundant circuit as the masking time setter 5 including a timer etc. is used.

When the input signals 31–33 consist of 1 bit, the majority circuit 200, the self-diagnostic circuit 4, and a mismatch detector 3 do not become large. But the number of the output signals is usually more than 32 bits in current processing units. Thus, each of the majority circuits 200, the self-diagnostic circuit 4, and the mismatch detector 3 need to be at least 32 bits large, and the total circuit scale becomes large.

Furthermore, according to Japanese Examined Patent No. HEI 3-26415 bulletin, the majority circuit is multiplexed to improve its reliability, and the majority result is output to the function circuit through a driver. High reliability is obtained by implementing the multiplexed majority circuit in an LSI circuit in this method. FIG. 30 shows a configuration in applying this method to a computer and a controller connected to the computer. Though the majority circuit 200 is multiplexed in this way, when the driver 16-2 or the controller of the next stage (for example, a receiver 13-4 of a controller 18) is faulty, a correct result cannot be output to a system bus. And though a function circuit 14 is multiplexed, when the driver 16-2 of the majority circuit or the receiver 18-4 is faulty, the correct input cannot be provided to the function circuit 14. In this case, multiplexing the function circuit is irrelevant.

In a fault-tolerant computer, a processing unit is triplicated and an output signal is decided by majority logic. In this way, the reliability of the fault-tolerant computer is improved. And the reliability is also improved by duplicating modules of circuits from the next stage of the majority circuit. FIG. 31 shows a system described in Japanese Unexamined Patent No. HEI 2-202636 bulletin. There are majority circuits 200-1 and 200-2 each in global memories #1, #2 respectively in this system. The majority circuits 200-1 and 200-2 compare the outputs of three processing units (CPU #A, CPU #B and CPU#C), detect the majority, and output the majority result to a system bus. The majority circuit is duplicated in this configuration, and each majority circuit works independently. But the circuits do not exchange signals for confirming each operation mutually, so that the circuits are not duplicated in an exact meaning. Accordingly, an error occurring in one of the majority circuits results in an output of a wrong signal to the system bus.

FIG. 32 shows another system for improving the reliability of the majority circuit, which is described in Japanese Examined Patent No. HEI 3-46851 bulletin. In this system, the outputs from three processing units are input to the majority circuit 200 through an error correction code encoder(ECC/ENC) 28 and the output of the majority circuit 200 is input to an error correction code decoder (ECC/DEC) 29. Accordingly, bit errors can be corrected by the error correction code decoder 29.

The relationship between a faulty element and an element for avoiding an error is shown in FIG. 33. In the case of an error occurring in a path, the error can be avoided by circuits or elements of the next stage. In this way, this system puts the principal object to improve the reliability of the multiplexed circuit. But this system does not pay attention to specifying the error location and repairing the faulty element. Thus, it takes a long time to disconnect, repair or exchange the faulty element automatically by CPU because the error location cannot be specified.

FIG. 34 shows another system for improving the reliability of the majority circuit, which is described in Japanese Unexamined Patent No. HEI 1-98034 bulletin. Parity generators 23-1–23-3 for each output of the systems 1–3 are comprised in this system. Parity generator 23-4 is also comprised for the output of the majority circuit 200. An error occurring in systems 1–3 is detected by comparing the outputs of the parity generators 23-1–23-3. An error occurring in the majority circuit 200 is detected by comparing the outputs of the parity generators 23-1–23-4. Generally, the systems 1–3 are processing units and it is a rare case that only one bit of the plural bits of the outputs of the processing units differs from the others. For example, plural bits may differ when the processing unit is faulty in executing branch instruction and branches to different location. Generally, the parity check method can detect only one bit error. Thus, errors occurring in systems 1–3 cannot be adequately specified by comparing the outputs of the parity generators 23.

A system for correcting an error occurring in the majority circuit is described in Japanese Examined Patent No. HEI 3-46851 bulletin as shown in FIG. 32. By this system, one-bit errors occurring in the majority circuit can be automatically corrected, and plural bits error can be detected. But the circuit scale of the error correction code encoder/decoder is large.

In a multiplexed system with the majority logic, when the faulty system is left connected, the output of the majority circuit is still influenced by the faulty system. Systems for disconnecting a faulty system and selecting a main system from several systems have been proposed. For example, disconnecting a faulty system and selecting the main system from plural systems can be carried out by a system described in Japanese Unexamined Patent No. SHO 57-36356 bulletin (this is not illustrated). But even in the majority circuit for one bit, as described in the bulletin, a lot of logic circuits are needed for disconnecting the faulty system and selecting the main system from plural systems. In case of plural bits (n bits), almost n times as many logic circuits are needed. And in this system, the majority result becomes ineffective when the main system is selected, so that the reliability is reduced.

Another system for disconnecting the faulty system is described in Japanese Unexamined Patent No. HEI 1-126825 bulletin (this is not illustrated). In this system, a purging circuit can disconnect the faulty system. But in case of the majority circuit for plural bits (n bits), almost n times as many logic circuits are needed.

Problems Solved by the Invention

According to the conventional techniques as mentioned above, various kinds of systems have been provided to improve reliability of the majority circuit. But there are still problems as follows.

Problem 1: In case of a majority circuit configured as a simple circuit, the signal from the majority circuit becomes effective even if two processing units are faulty. Thus, a wrong signal may be provided to the next circuit to cause a malfunction of the next circuit.

Problem 2: When a masking time setter is provided and comprised to prevent an improper fault detection of a mismatch of inputs of the majority circuit, it is difficult to set the time based on the bus operation because the masking time setter is configured by a timer, etc. And a redundant circuit as the masking time setter including a timer, etc., is needed.

Problem 3: In the case of the majority circuit being applied to the processing unit, the circuit scale becomes large because the output of the processing unit has plural bits. And when an error is corrected to improve reliability of the majority circuit, the circuit scale becomes large.

Problem 4: When a function circuit is separated from the majority circuit, a faulty driver of the majority circuit or a faulty receiver of the function circuit causes a wrong input to the function circuit. Accordingly, even if reliability of the majority circuit improves, the reliability of the total circuit including the function circuit does not improve.

Problem 5: Though the majority circuit connected to the processing unit (or a controller including the majority circuit) is duplicated, two majority circuits do not exchange signals mutually. Thus, a wrong signal may be input to the system bus in case of an error occurring in the majority circuit.

Problem 6: When an error correction code encoders/decoders are included, an error can be avoided, but it is difficult to repair or exchange a faulty element because the error location cannot be specified.

Problem 7: When parity generators are included, the outputs of the parity generators are compared and checked. But plural bit errors of the output of the processing units may not be checked because the parity check method can detect only one-bit errors.

Problem 8: In a conventional system for disconnecting a faulty system, disconnecting is carried out bit-by-bit, so that in case of plural bits (n bits), almost n times as many logic circuits are needed.

Problem 9: In case of selecting a specific system from plural systems, only the output of the specified system is selected and the majority result becomes ineffective. This causes the reliability of the whole system to go down.

SUMMARY OF THE INVENTION

This invention is provided to solve the problems mentioned above.

The object of the invention is to prevent a wrong signal from being provided to the next circuit in case of double errors of the plural systems or multiplexed processing units.

Another object of the invention is to prevent a faulty detection of a mismatch based on the bus operation of the processing units.

Another object of the invention is to improve the reliability of the majority circuit with a configuration of fewer circuits.

Another object of the invention is to improve reliability of the whole system, including a driver, a receiver or a function circuit.

Another object of the invention is to improve an error detection ability of the duplicated majority circuits (in the control circuit).

Another object of the invention is to provide an ability to disconnect a faulty system by specifying an error location and checking a majority result with fewer circuits.

Another object of the invention is to provide a majority circuit which can continue an operation as far as possible even if all outputs of the plural systems are different.

Another object of the invention is to provide a general purpose semiconductor integrated majority circuit having the above-mentioned feature.

A majority circuit according to this invention receives X (X>=3) number of n-bit (n>=1) signals from X number of systems and outputs one of the input signals as a majority signal to a next circuit. One embodiment includes the following:

(a) compare means for receiving a first plurality X of input signals, making a second plurality Y of signal combinations (X>Y>=2) of the input signals; and (b) selection means for receiving X input signals, selecting one input signal as the majority signal based on a comparison result of the compare means.

The majority circuit may further include error recognition means for recognizing an existence of a faulty system among X number of systems based on the comparison result of the compare means.

In the majority circuit, the compare means may have a third plurality of comparison circuits, corresponding to the Y combinations, each comparison circuit receiving Y number of n bit signals. The compare means may compare n number of corresponding bits of Y number of input signals and detect a match of Y number of input signals. It may then output the comparison result which indicates the match of Y number of input signals.

In the majority circuit, the selection means may have level set means for setting a level of the majority signal to a specific level based on the comparison result of the compare means so that the majority signal does not give any influence to a next circuit which receives the majority signal.

In the majority circuit, each of the systems may provide a control signal which indicates the validity of the signal from the system. The majority circuit may further include window means for receiving the control signals from the systems and for generating an error check signal which controls the error recognition in error recognition means.

The majority circuit may further include receive means for receiving comparison results of another majority circuit and generating a new comparison result based on both of the comparison results from its own compare means and that of the other majority circuit.

In the majority circuit, the majority circuit may have a plurality of the compare means and may generate the comparison result based on the plurality of the compare means.

The majority circuit may further include register means for registering the comparison result, and interrupt means for generating an interrupt to the systems based on the comparison result registered by the register means.

The majority circuit may further include mask means, located between the compare means and select means, for masking the comparison result from the compare means.

The majority circuit may further include mask means, located between the compare means and select means, for giving a priority to a specific system for selecting the input signal of the specific system.

The majority circuit may further include code generate means which generates a check code for checking an error in the signal and appends the check code to the input signal.

In the majority circuit, the compare means may compare the input signals including the check code, and the selection means may select the majority signal which includes the check code.

The majority circuit may further include check means for checking the majority signal based on the check code included in the majority signal.

A controller according to this invention receives a fourth plurality X (X>=3) of signals from X systems and outputs one of the input signals as a majority signal to a next circuit. One embodiment of the controller includes the following:

(a) X number of receivers for receiving X number of signals from X number of systems respectively; and (b) a majority circuit as set forth above for receiving X signals from X receivers as the input signals.

A second embodiment of the controller according to this invention receives a fifth plurality X (X>=3) of signals from X number of systems and outputs one of the input signals as a majority signal to a next circuit. This embodiment may include the following:

(a) X number of feature circuits for receiving X number of signals from X number of systems respectively and performing a predefined feature therein; and (b) the majority circuit as described above for receiving X number of signals from X number of feature circuits as the input signals.

A semiconductor integrated majority circuit according to this invention may include the majority circuit which is integrated on a semiconductor.

A controller according to this invention may include a plurality of the semiconductor integrated majority circuits.

A majority circuit according to another embodiment of the invention receives three n-bit signals from three systems and outputs one n-bit signal as a majority signal to a next circuit. This embodiment includes the following:

(a) three comparators, providing three combinations of two out of the three n-bit signals, each comparator including a number of compare gates and an output gate. In the comparators, each of the compare gates receives and compares the corresponding two bits of the two n-bit signals and outputs a comparison result, and the output gate receives a number of the comparison results from the number of compare gates and outputs a comparison signal, which indicates whether the two n-bit signals match or not; and (b) a selector for receiving the comparison signals from the three comparators and three n-bit signals from the three systems, and selecting one n-bit signal as the majority signal based on the three comparison signals.

In the majority circuit, the compare gate may be an exclusive-OR gate and the outputs gate may be an AND gate.

A majority method according to one embodiment of this invention receives three n-bit signals from three systems and outputs one n-bit signal as a majority signal. This embodiment includes the steps of:

(a) making three different combinations of two n-bit signals from the three n-bit signals;

(b) comparing two n-bit signals bit-by-bit for three different combinations;

(c) outputting the three comparison results as the comparison signals; and, (d) selecting one n-bit signal out of three n-bit signals as the majority signal based on the comparison signals.

The majority method may further include the step of detecting a faulty system among the three systems based on the comparison signals.

A majority method according to another embodiment of this invention, which has two majority circuits, receives three n-bit signals from three systems and outputs one n-bit signal as a majority signal. This embodiment includes the steps of:

(a) in each of the majority circuits, receiving three n-bit signals from three systems and making three different combinations of two n-bit signals out of three n-bit signals;

(b) in each of the majority circuits, comparing two n-bit signals bit-by-bit for three different combinations;

(c) in each of the majority circuits, outputting the three comparison results as the comparison signals; and (d) selecting one n-bit signal out of three n-bit signals as the majority signal based on the comparison signals from the two majority circuits.

As described above, this invention brings the following effects:

A wrong signal is prevented from being provided to a next circuit in case of multiple faults of the processing units.

Faulty detection of a mismatch can be prevented since the detection is performed by synchronizing detection with the output bus operation of the processing unit.

The reliability of the system including the driver, the receiver and the function circuit can be improved.

The ability of error detection of the duplicated majority circuit (in the control circuit) can be improved.

The error location can be specified.

The validity of the output of the majority circuit can be detected with fewer circuits.

A faulty element can be disconnected easily.

The operation can be continued as long as possible even if the outputs of three processing units are all different.

The semiconductor integrated majority circuit having the above features can be provided.

BRIEF DESCRIPTION OF THE DRAWING

In the drawings,

FIG. 5 shows an operation of the majority circuit 2;

FIG. 7 shows an operation of the majority circuit 2 in Embodiment 2 of the invention;

FIG. 12 shows an operation of the majority circuit;

FIG. 16 shows an operation of the majority circuit 2-1;

FIG. 19 shows an operation of the majority circuit 2-1;

FIG. 29 shows an operation of the conventional majority circuit;

FIG. 33 shows an error avoidance of the conventional majority circuit; and

DETAILED DESCRIPTION OF THE PREFERRED EMBODIMENTS

Embodiment 1.

Figure 1:
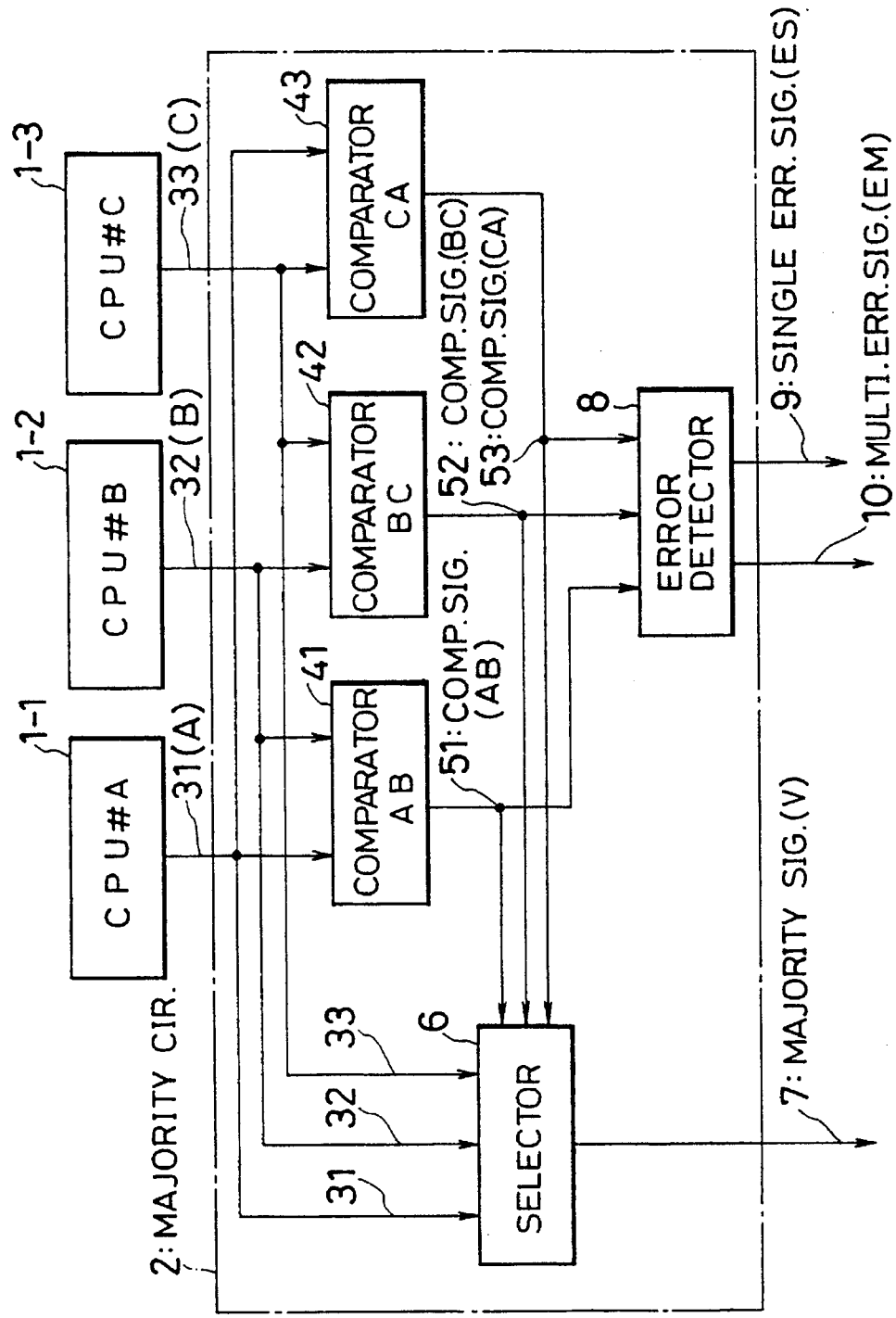
FIG. 1 is a block diagram which shows a general configuration of the majority circuit in Embodiment 1 of the invention.

FIG. 1 is a block diagram which shows a general configuration of the majority circuit related to Embodiment 1 of the invention. For clarity sake, the same signs are used for the common elements with FIG. 27.

Figure 27:
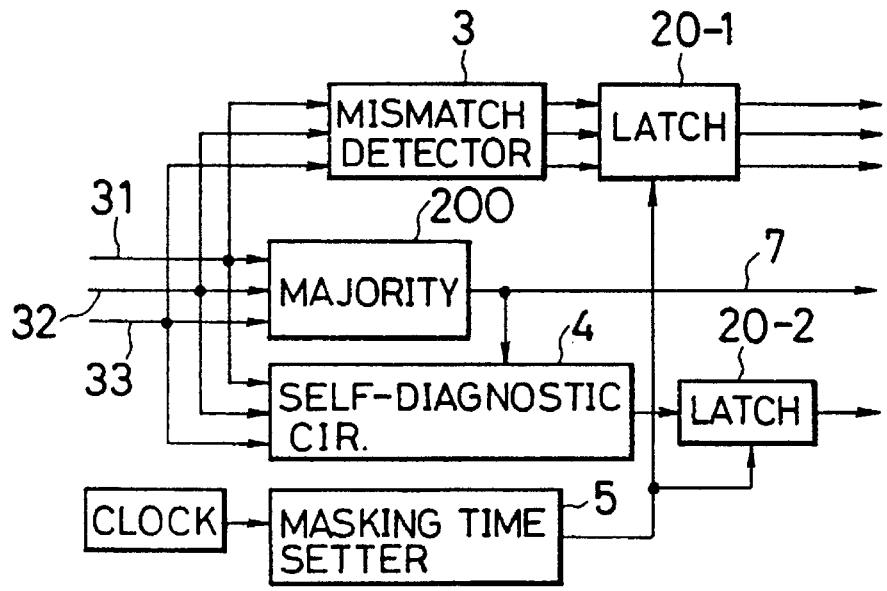
FIG. 27 shows a conventional majority circuit.
Figure 28:
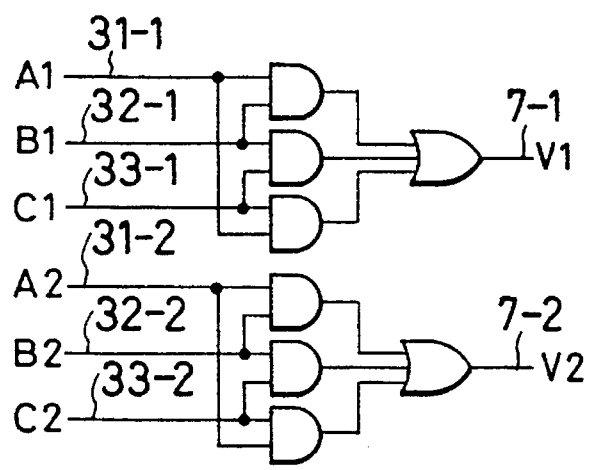
FIG. 28 shows a configuration of the conventional majority circuit.

In this majority circuit 2, one of the aspects different from the conventional majority circuit of FIG. 27 is that a compare means, including comparators 41–43, and a selector 6 (a select means) are used instead of the majority circuit 200 configured as shown in FIG. 28. Another different aspect is an error detector 8 (an error recognition means) is used instead of the mismatch detector 3. Input signals 31–33 from processing units 1-1–1-3 are provided to the comparators 41–43 and the selector 6. The selector 6 selects one of the input signals 31–33 as a majority signal 7 based on comparison signals 51–53 from the comparators 41–43. And the error detector 8 detects an error by analyzing the comparison signals 51–53.

Figure 2:
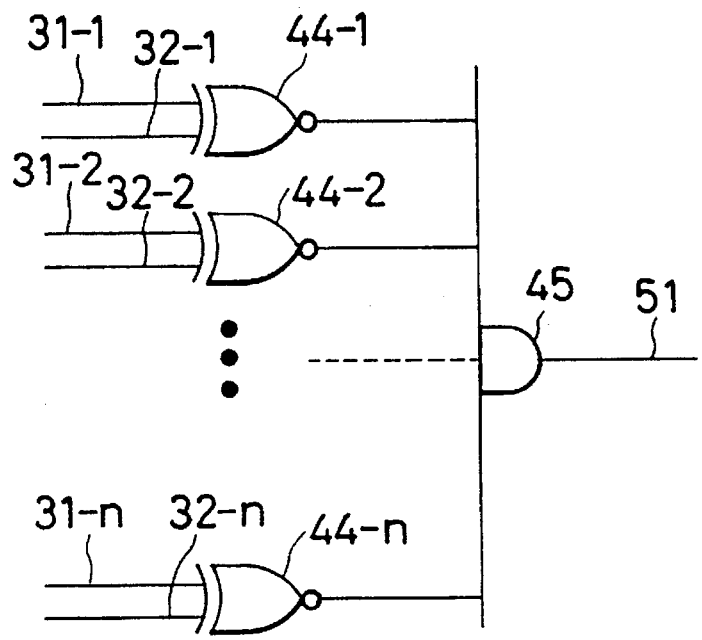
FIG. 2 shows a comparator 41.

FIG. 2 show a configuration of the comparator 41 in FIG. 1. Each of input signals 31-1–31-n shows each bit of the input signal 31 input to the majority circuit 2 from the processing unit 1-1. In the same way, each of input signals 32-1–32-n shows each bit of the input signal 32 input to the majority circuit 2 from the processing unit 1-2. Reverse exclusive OR circuits (EXNOR gates) 44-1–44-n compare the input signals 31 and 32 bit-by-bit. The reverse exclusive OR circuit (EXNOR gate) outputs "1" when the input signals match. An AND gate 45 ANDs n bits. The AND gate outputs "1" as the comparison signal 51, when all of input signals of n bits are "1". In this way, the comparator 41 compares each of n bits of the input signal 31 from the processing unit 1-1 and each of n bits of the input signal 32 from the processing unit 1-2, and outputs the comparison signal 51.

In the same way, the comparator 42 compares the input signal 32 of n bits from the processing unit 1-2 and the input signal 33 of n bits from the processing unit 1-3, and outputs the comparison signal 52. And the comparator 43 compares the input signal 33 of n bits from the processing unit 1-3 and the input signal 31 of n bits from the processing unit 1-1, and outputs the comparison signal 53.

Figure 3:
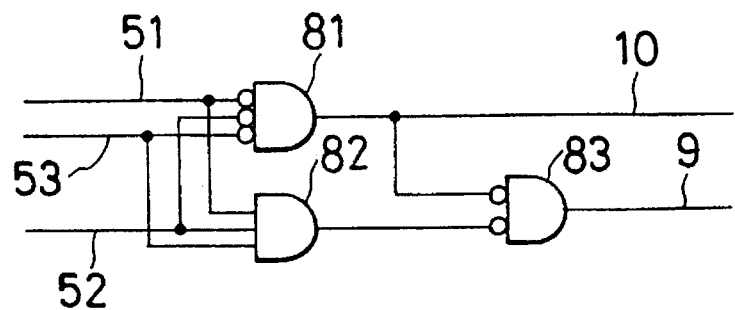
FIG. 3 shows a configuration of an error detector 8.

FIG. 3 shows a configuration of the error detector 8 of FIG. 1. A 3-input reverse OR circuit (NOR gate) 81 outputs "1" as a multiple error signal 10, when all of the comparison signals 51–53 are "0". A 3-input AND circuit 82 outputs "0", when one of the comparison signals 51–53 is "0". A 2-input NOR gate 83 outputs "1" as a single error signal 9, when the multiple error signal 10 is "0" and the 3-input AND gate 82 outputs "0".

Figure 4:
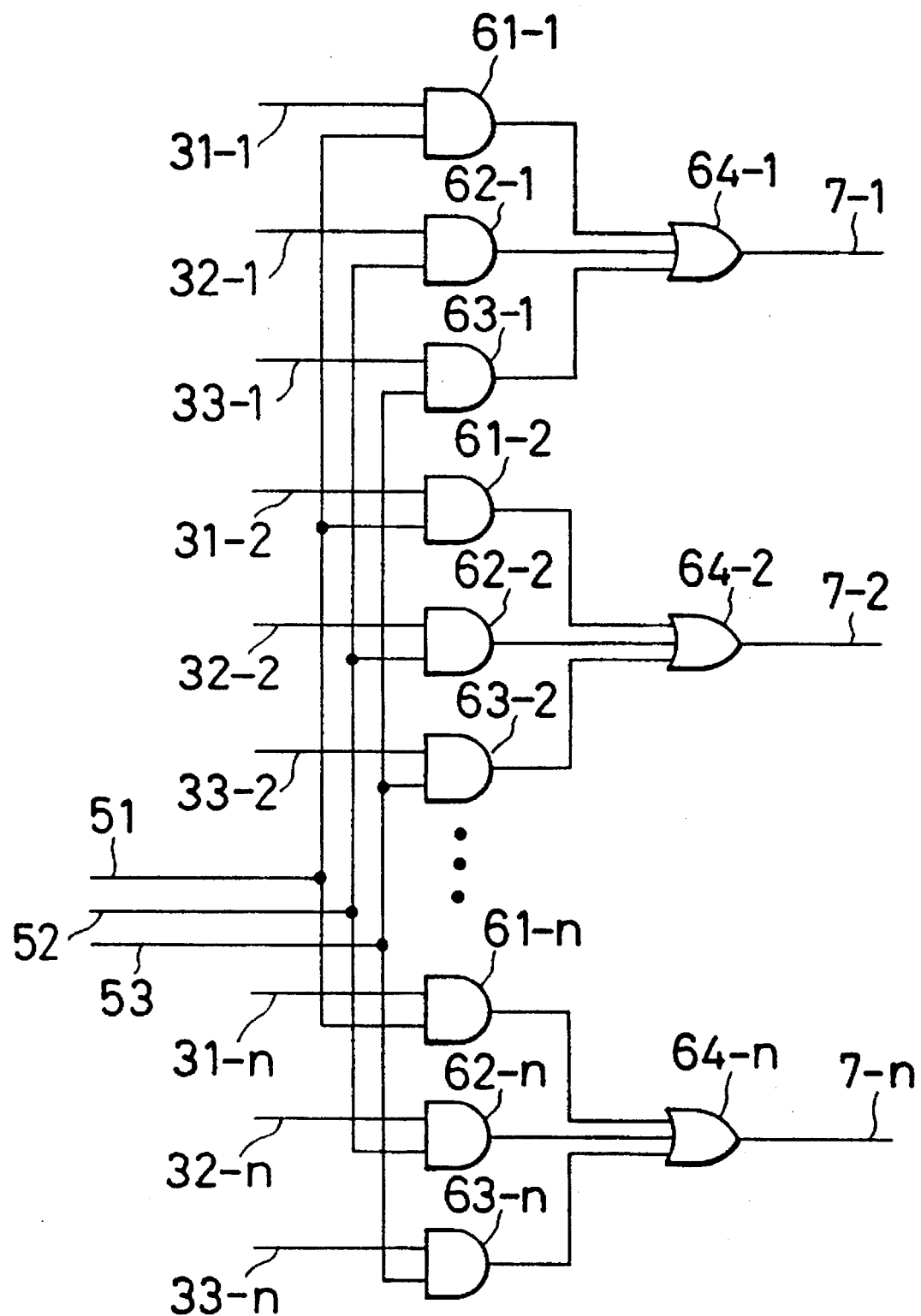
FIG. 4 shows a configuration of a selector 6.

FIG. 4 shows one configuration of the selector 6 of FIG. 1. Each one of two inputs to the 2-input AND gates 61-1–61-n, 62-1–62-n, 63-1–63-n receives the output from three processing units and the other input is each of the comparison signals 51–53. When the comparison signals 51–53 are "1", the output signals of the corresponding processing unit are outputted as majority signals 7-1–7-n via a 3-input OR gate 64.

FIG. 5 shows input signals, the comparison signals and the output signals of the majority circuit of FIG. 1. To facilitate the explanation, the output signals of the processing units have two bits (n=2) in this figure. A–C indicates each of the signals 31–33 received by the majority circuit 2 from the processing units 1-1–1-3. Each AB, BC, and CA shows each of the comparison signals 51–53. V shows the majority signal 7. ES shows the single error signal 9. EM shows the multiple error signal 10.

The following is an explanation about an operation of the majority circuit configured as described above. An operation of the comparator 41, the selector 6, and the error detector 8 is mainly explained using FIGS. 2, 3, and 4 in reference with FIG. 5.

In FIG. 5, the first line and the second line show the cases in which all outputs of three processing units are equal. In these cases, all outputs of the 2-input EXNOR gates 44-1–44-n in the comparator 41 become "1". Thus, the comparison signal 51, which is an output signal from the AND gate 45, becomes "1". In the same way, the comparison signal 52 and the comparison signal 53 also become "1".

The comparison signals 51–53 which are "1" as described above are received by the selector 6. Each of the 2-input AND gates 61-1–61-n, 62-1–62-n, and 63-1–63-n outputs a signal which is the same with each of the input signals 31-1–31-n, 32-1–32-n, and 33-1–33-n. These signals are also output as the majority signals 7-1–7-n via the 3-input OR gates 64-1–64-n.

The output signal of the 3-input NOR gate 81 (that is, the multiple error signal 10) becomes "0" in the error detector 8. And the 3-input AND gate 82 outputs "1". Thus, the 2-input NOR gate 83 outputs "0".

The third line of FIG. 5 shows a case in which only one of outputs of three processing units, the output of the processing unit 1-1, is different from the others. In this case, the comparison signal 51 of the comparator 41 and the comparison result signal 53 of the comparator 43 becomes "0". The comparison signal 52 of the comparator 42 becomes "1". The selector 6 outputs signals which are the same with the input signals 32-1–32-n received by the 2-input AND gates 62-1–62-n. The 2-input AND gates 61-1–61-n and 63-1–63-n output "0" in these cases. The input signals 32-1–32-n are used as output signals of the 3-input OR gates 64-1–64-n. Thus, the outputs of the processing unit 1-2 are selected as the majority signals 7-1–7-n.

The output signal of the 3-input NOR gate 81 (that is, the multiple error signal 10) becomes "0" in the error detector 8. The 3-input AND gate 82 outputs "0". Thus, the output signal of the 2-input NOR gate 83 (that is, the single error signal 9) becomes "1".

The sixth line of FIG. 5 shows a case in which only one of the outputs of three processing units is different. In this case, the outputs of the processing unit 1-1 are selected as the majority signals 7-1–7-n. The other operation is the same with the third line.

The fourth line, the fifth line, and the seventh line of FIG. 5 show the cases in which input signals 31–33 from three processing units are all different. In this case, the comparison signals 51–53 of the comparators 41–43 become all "0". These comparison signals 51–53 are received by the selector 6. Because the comparison signals 51–53 are all "0", all of the 2-input AND gates 61-1–61-n, 62-1–62-n, and 63-1–63-n output "0", regardless of the contents of the input signals 31-1–31-n, 32-1–32-n, and 33-1–33-n. Thus, all of the 3-input OR gates 64-1–64-n output "0" as the majority signals 7-1–7-n.

The output of the 3-input NOR gate 81 (that is, the multiple error signal 10) becomes "1" in the error detector 8. The 3-input AND gate 82 outputs "0". Thus, the output signal of the 2-input NOR gate 83 (that is, the single error signal 9) becomes "0".

As described above, a system may improve the reliability of the computer by using the majority circuit and three processing units, which execute the same instruction. The majority circuit of this embodiment includes the comparator for comparing each of two outputs from the three processing units, the selector for selecting an output of the normal processing unit, and the error detector for detecting a single error or multiple errors of the processing unit based on the comparison signal of the comparators.

In this embodiment, the comparators compare each of two outputs from three processing units, and the comparison signals are received by the selector and the error detector. The selector selects one output signal of the processing unit based on the comparison results. When all outputs of the processing units are different, the selector does not output any signals. The error detector analyzes the comparison signals and outputs the error status so that multiple errors of the processing unit can be detected.

Accordingly, an output of the normal processing unit is specified and is selected when an error occurs in one of the processing units. When the plural processing units produce errors, it is detected as a multiple error.

In this embodiment, the majority circuit includes an error detector, but the error detector is not always needed. The selector selects none of the input signals, when the input signals are all different. When a next circuit of the selector operates with "1" as an effective level, it will operate with no error as the selector output "0" as the majority signal.

Embodiment 2.

Figure 6:
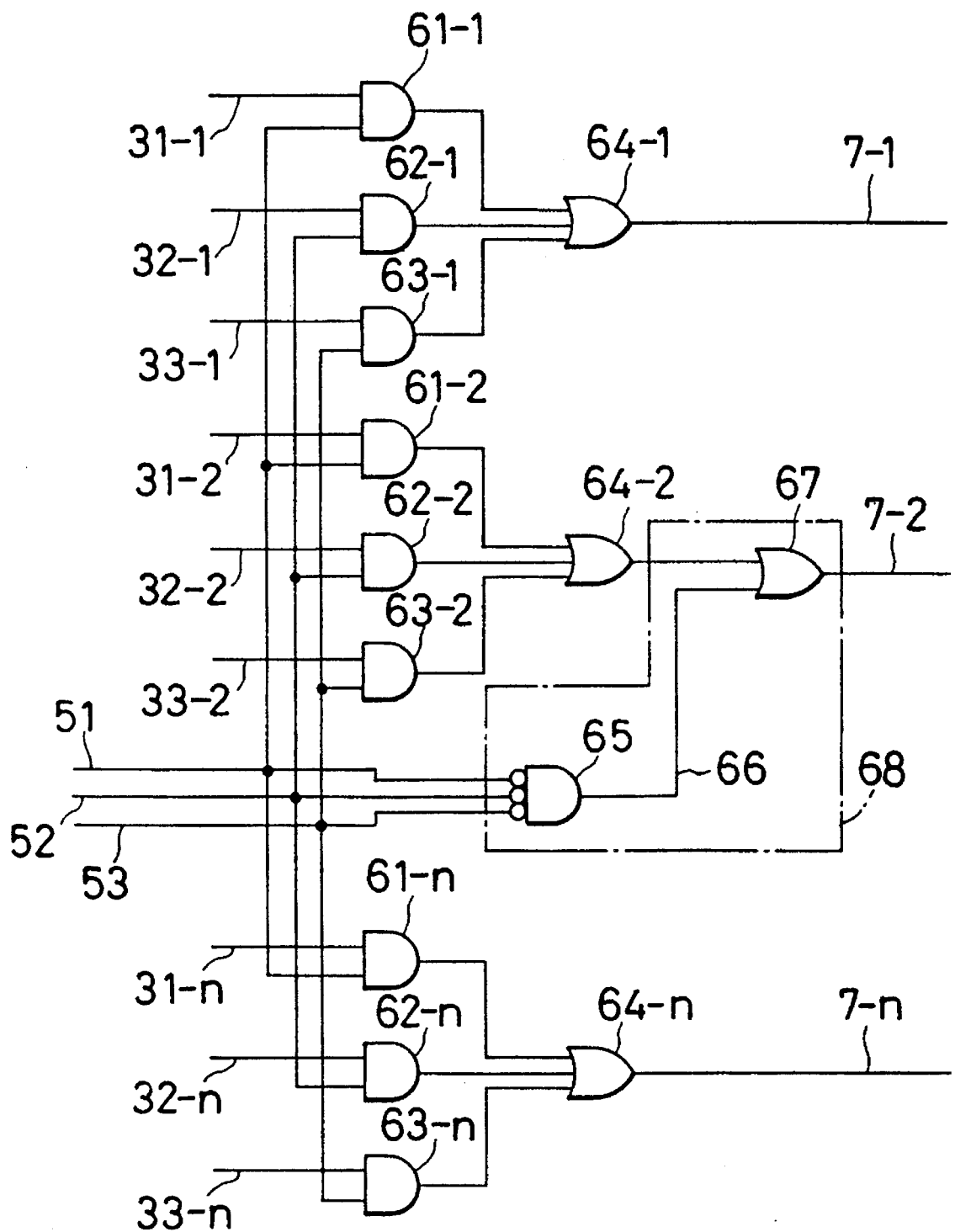
FIG. 6 shows a configuration of the selector 6.

As shown in FIG. 6, a level set circuit 68 is provided for in the second bit of the selector 6 of FIG. 4. The level set circuit 68 includes a 3-input NOR gate 65 and a 2-input OR gate 67. The level set circuit sets a level of the majority signal 7-2 based on the comparison signals 51–53. Assuming that a next circuit operates with "0" as an effective level when the level of the majority signal 7-2 is "0", and assuming that the selector 6 does not select any input signals, the level set circuit 68 forces the level of the majority signal 7-2 to "1" to prevent an operation of the next stage circuit.

FIG. 7 shows an operation when the selector of FIG. 6 is used instead of the selector of FIG. 4. The reference numerals of FIG. 7 have the same definitions as those of FIG. 5.

The following is an explanation of the operation of the majority circuit, configured as described above, with reference to FIGS. 6 and 7. Different aspects from Embodiment 1 will be emphasized.

When all outputs of three processing units are equal as shown in the first and the second line, and when one of outputs of three processing units differs from the others as shown in the third and the sixth line, the operations are the same with Embodiment 1 because the 3-input NOR gate 65 in the level set circuit 68 outputs "0" in these cases.

When the outputs of three processing units are all different as shown in the fourth, the fifth, and the seventh line, the 3-input NOR gate 65 in the level set circuit 68 outputs "1" because the comparison signals 51–53 are all "0". Thus, the output signal of the 2-input OR gate, that is, the majority signal 7-2, is forced to "1".

As described above, the selector of the majority circuit of this embodiment includes the level set circuit for setting the level of the majority signal as ineffective for the next control circuit when any input signals are not outputted based on the comparison signals from the comparators.

In this way, the level set circuit is used for outputting the predetermined level of signals, when the comparison signals from the comparators are all "0". Thus, a wrong signal can be prevented from being output to the next circuit.

In this embodiment, the level set circuit 68 is comprised in the second bit. Another level set circuit 68 can be provided for another bit whose effective level is "0" in the next circuit.

Embodiment 3.

Figure 8:
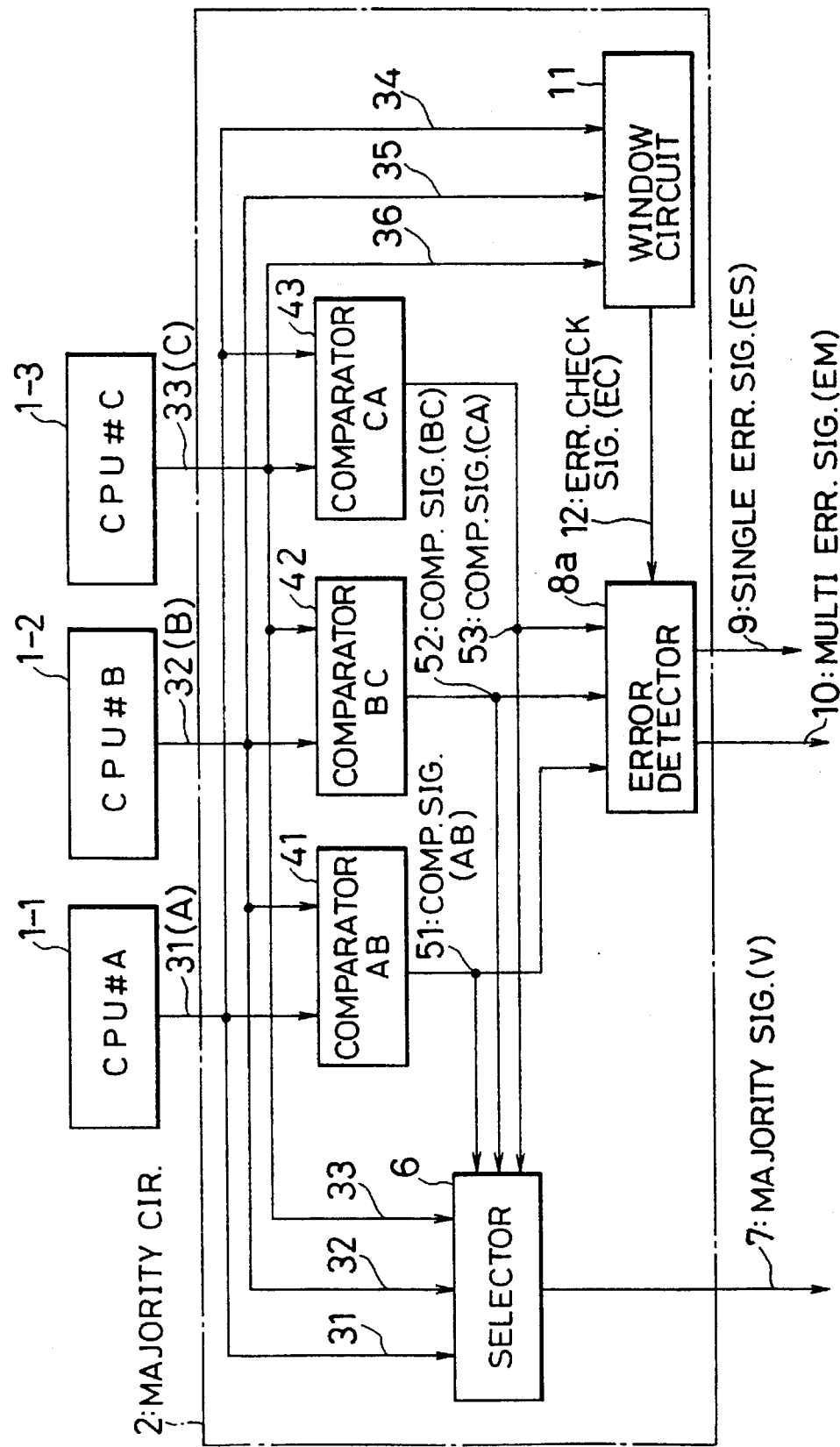
FIG. 8 is a block diagram which shows a general configuration of the majority circuit in Embodiment 3 of the invention.

FIG. 8 is a block chart which shows the general configuration of the majority circuit related to Embodiment 3 of the invention. For clarity sake, the same signs are used for the elements common with Embodiment 1.

The majority circuit of this embodiment includes a window circuit 11 in the majority circuit. Different aspects from the conventional majority circuit shown in FIGS. 27 are as follows. A compare means of comparators 41–43 and a selector 6 (a select means) are used instead of the majority circuit 2 shown in FIG. 28. An error detector 8a (an error recognition means) is used instead of the mismatch detector 3 of FIG. 27. A window circuit 11 is used instead of the masking time setter 5 of FIG. 27. The input signals 31–33 from the processing units 1-1–1-3 are supplied to the comparators 41–43 and the selector 6. Specific control signals 34–36 in the input signals from the processing units are received by the window circuit 11. The selector 6 selects one of the comparison signals 51–53 of the comparators 41–43 as the majority signal 7, and the error detector 8a evaluates the comparison signals 51–53 based on an error check signal from the window circuit 11.

Figure 9:
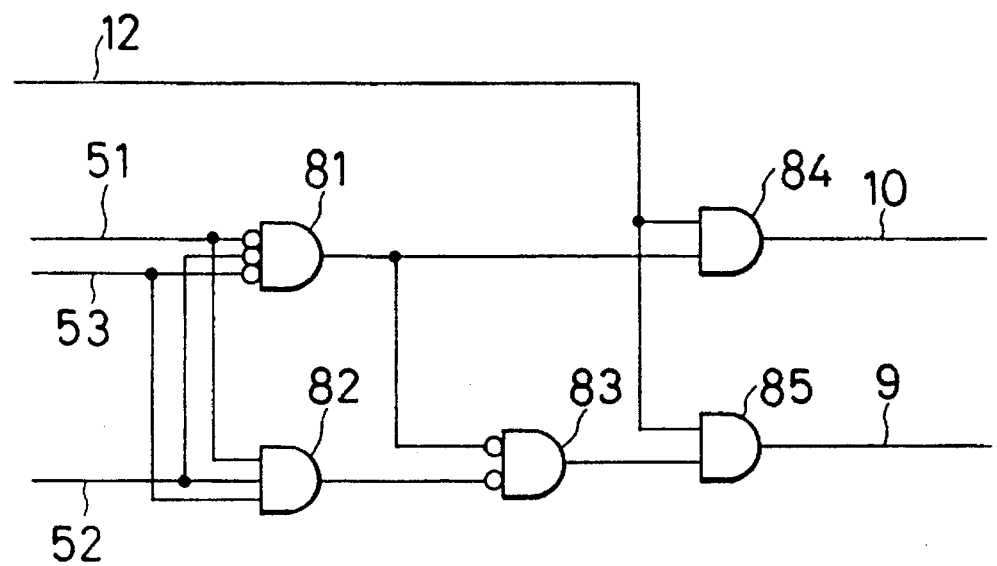
FIG. 9 shows a configuration of the error detector 8a in Embodiment 3 of the invention.

FIG. 9 shows a configuration of the error detector 8a of FIG. 8. This error detector includes 2-input AND gates 84, 85 which are provided for masking the output signals from the 3-input NOR gate 81 and the 2-input NOR gate 83.

Figure 10:
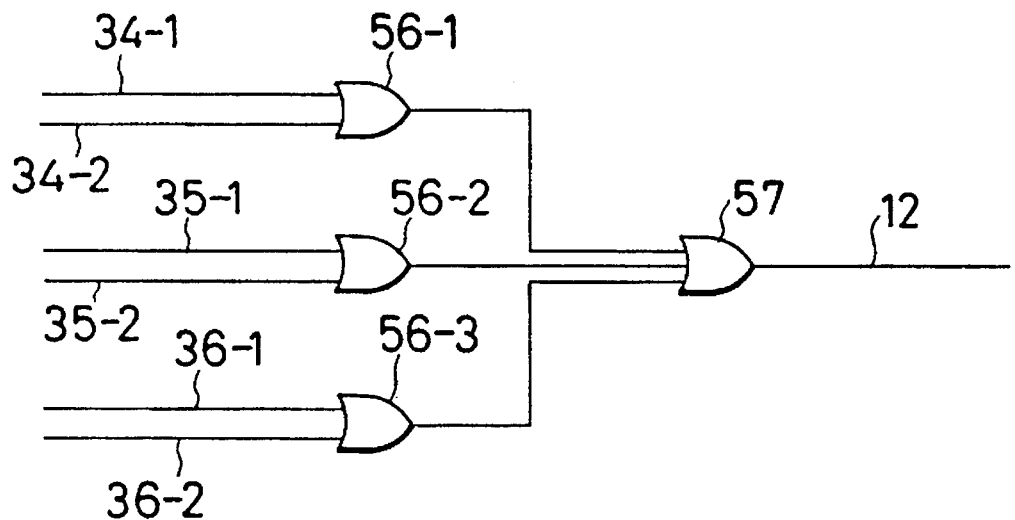
FIG. 10 shows a configuration of window circuit 11.

FIG. 10 shows a configuration of the window circuit 11 of FIG. 8. A specific control signal is received by the window circuit 11 from the processing unit. In one embodiment, one input of the 2-input OR gates 56-1–56-3 are address strobe signals 34-1, 35-1, and 36-1, which indicate that the addresses output from the processing units are valid. The other input of the 2-input OR gates 56-1–56-3 are data strobe signals 34-2, 35-2, and 36-2 which indicate that the data output from the processing units are valid. The output signals of the 2-input OR gates 56-1–56-3 are ORed via the 3-input OR gate 57, and its OR result is output as an error check signal 12.

Figure 11:
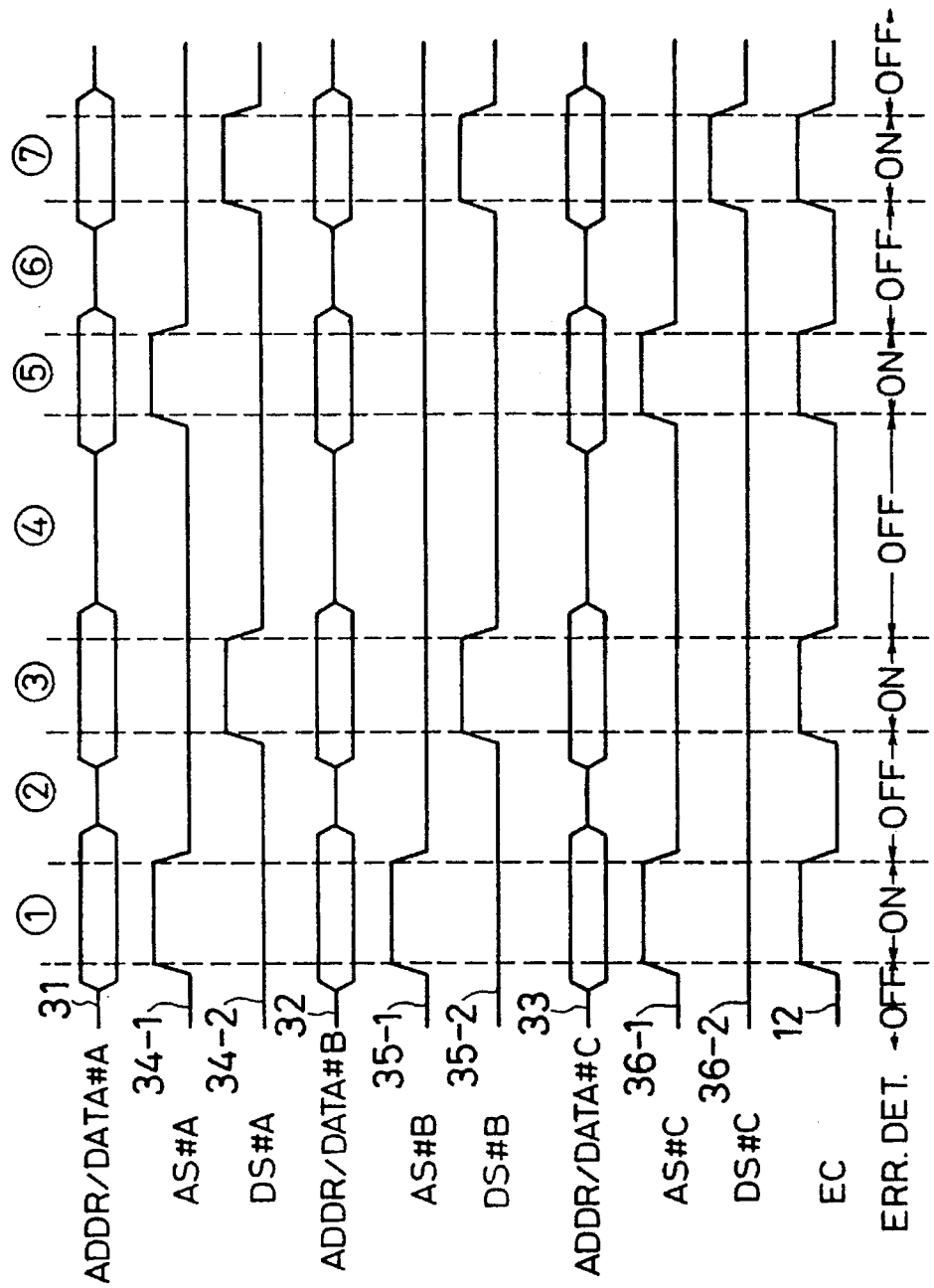
FIG. 11 is a timing chart which shows an operation timing of the majority circuit.

FIG. 11 is a timing chart of the input signals 31–33 of the processing units 1-1–1-3 in FIG. 8, the address strobe signals 34-1, 35-1, 36-1, the date strobe signals 34-2, 35-2, 36-2, and the error check signal 12.

FIG. 12 shows an operation of the majority circuit of FIG. 8. FIG. 12 shows the operation corresponding to the timing signals of FIG. 11. In the figures, ADDR/DATA shows the signal output to the address/data bus. AS shows the address strobe signal. DS shows the data strobe signal. EC shows the error check signal. ZZ means that the output signal of the processing unit is high impedance. X means that the comparison signal is in a floating state.

An operation of the majority circuit as described above, especially of its window circuit 11 and its error detector 8a, is explained with reference to FIGS. 9, 10, and 12.

In FIG. 12, the first line, the third line, the fifth line, and the seventh line show the cases in which one of the specific control signals, that is, the address strobe signals 34-1, 35-1, 36-1, and the data strobe signals 34-2, 35-2, 36-2, is at effective level "1". In these cases, one of the inputs of the 2-input OR gates 56-1–56-3 of the window circuit 11 in FIG. 10 becomes "1". Thus, the output signal of the 3-input OR gate 57, that is, the error check signal 12 becomes "1". Consequently, the output signals of the 2-input AND gates 84, 85, that is, the multiple error signal 10 and the single error signal 9, output the error status based on the comparison signals 51–53.

The second line, the fourth line, and the sixth line of FIG. 12 show the cases in which the input signals 31–33 of the processing units are high impedance "ZZ". In these cases, the comparison signals 51–53 output floating value "X", and the address strobe signals 34-1, 35-1, 36-1, and the data strobe signals 34-2, 35-2, 36-2 are all "0".

Thus, the inputs to the 2-input OR gates 56-1–56-3 of the window circuit 11 become all "0". The output signal of the 3-input OR gate 57, that is, the error check signal 12, becomes "0". Consequently, the output signals of the 2-input AND gates 84, 85 of the error detector 8a, that is, the multiple error signal 10 and the single error signal 9, always become "0" regardless of the comparison signals 51–53.

As described above, in this embodiment, the window circuit is used for generating the error check signal, which indicates the validity of the comparison signal of the comparator. The error detector is also used for prohibiting the error detection by the error check signal of the window circuit.

In this embodiment, the window circuit is used in a stage previous to the error detector for generating the error check signal. The window circuit outputs the error check signal when the specific control signal in the output signal of the processing units is at an effective level. The address strobe signal and the data strobe signal become floating status when the processing unit is in idle status or the bus is switching status. Even in such cases, the window circuit can prevent the faulty error detection of the processing unit. The masking condition for preventing the faulty error detection can be configured by a simple logic combination as shown in FIGS. 9 and 10.

Embodiment 4.

Figure 13:
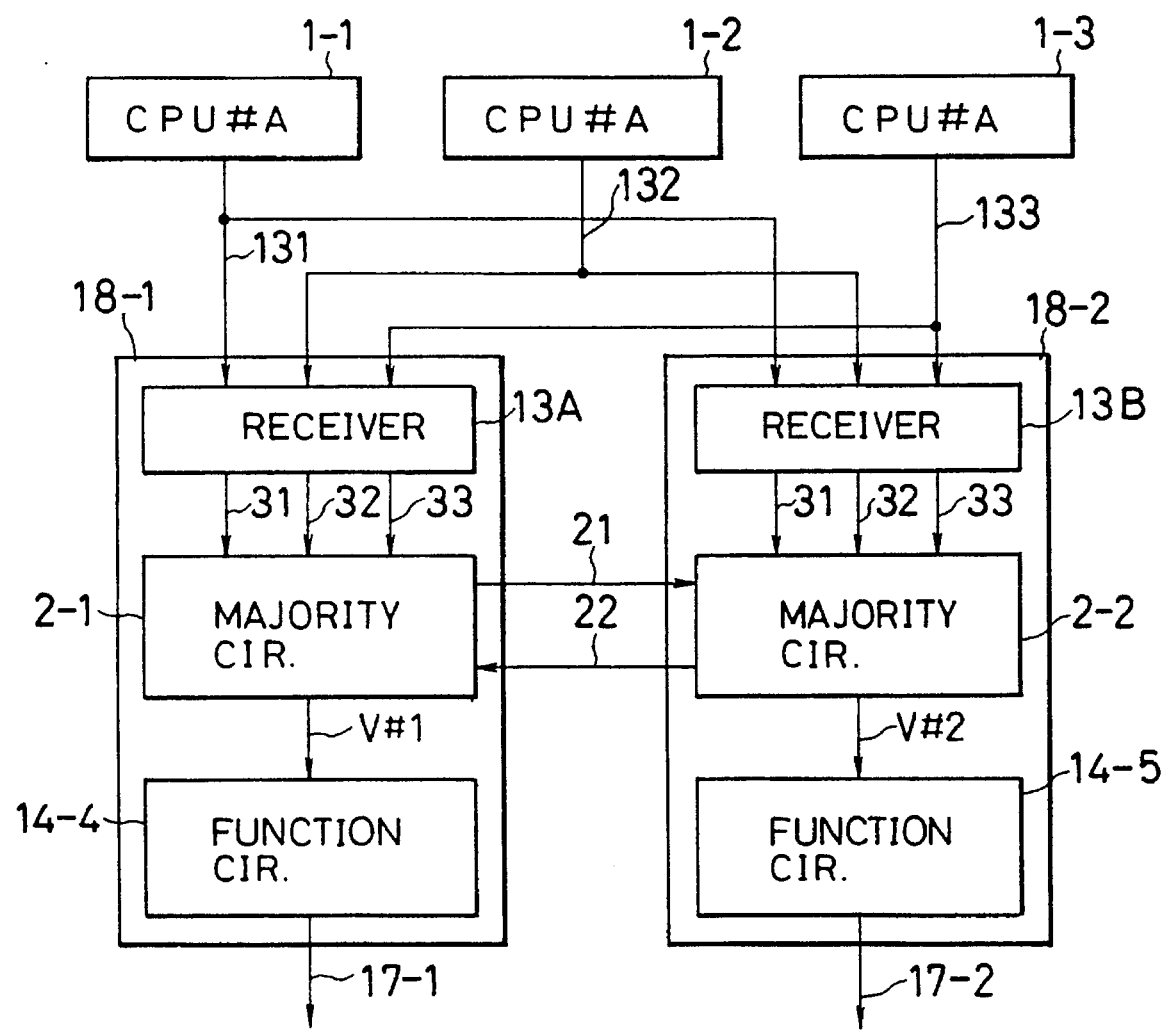
FIG. 13 is a block diagram of duplicated controllers in Embodiment 4 of the invention.
Figure 31:
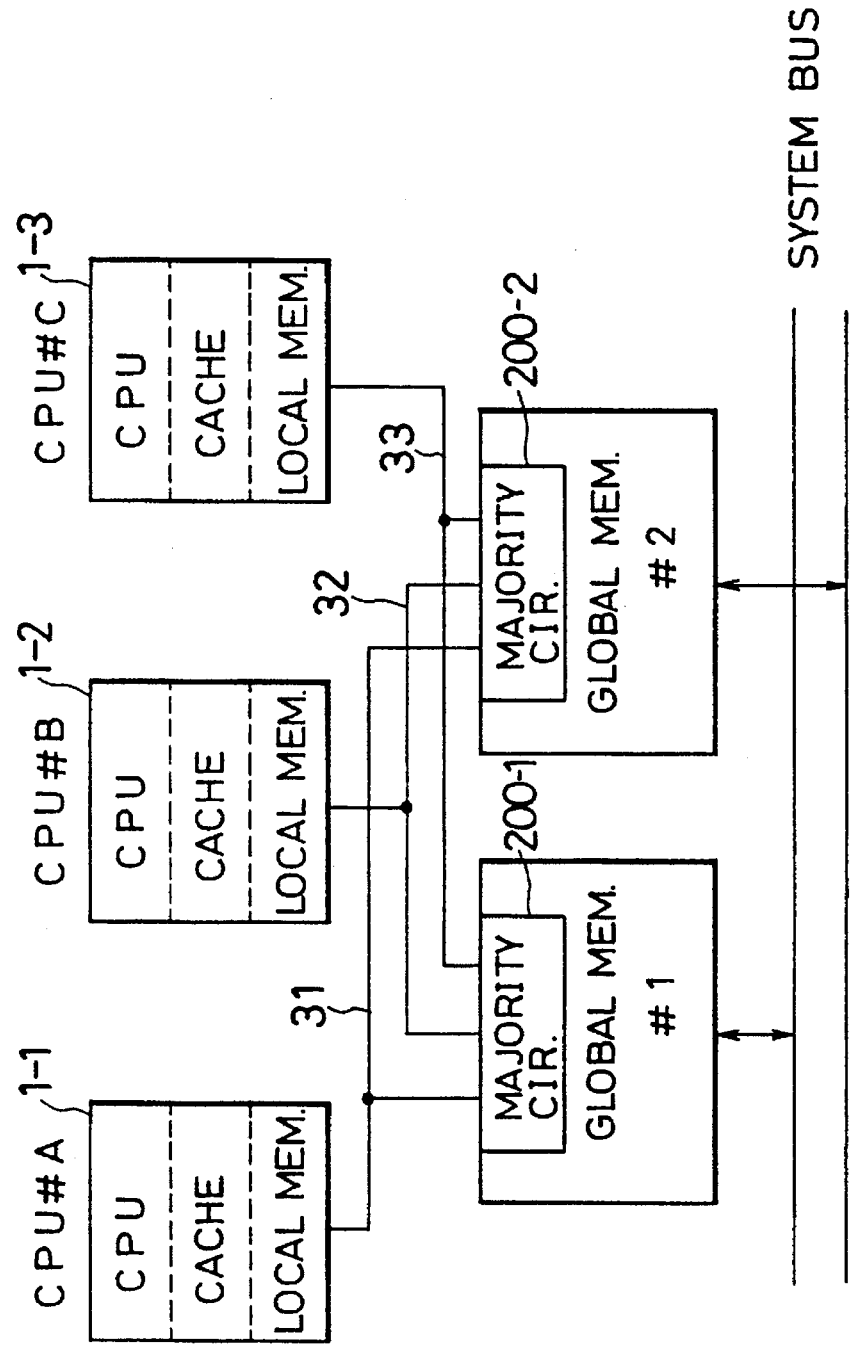
FIG. 31 shows duplicated system of the conventional majority circuit.

FIG. 13 is a block diagram which shows a general configuration of the controller of this Embodiment 4 of the invention. For clarity sake, the same signs are used for the common elements with the conventional majority circuit shown in FIG. 31.

Figure 30:
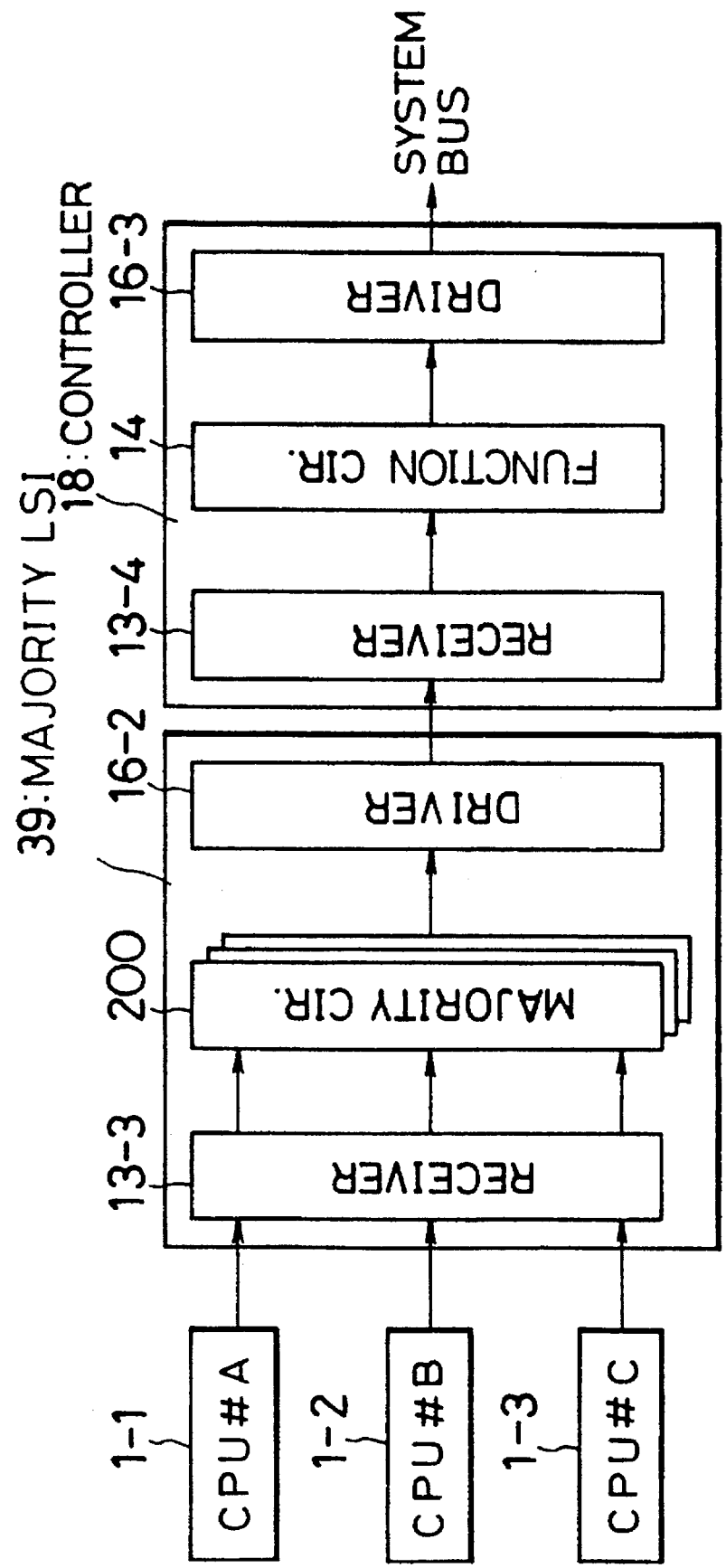
FIG. 30 shows a practical application of the conventional majority circuit.

A different aspect from the conventional controller shown in FIG. 30, is duplicated controllers comprising majority circuits 2-1 and 2-2, respectively, which exchange the comparison signals 21 and 22 mutually.

Figure 14:
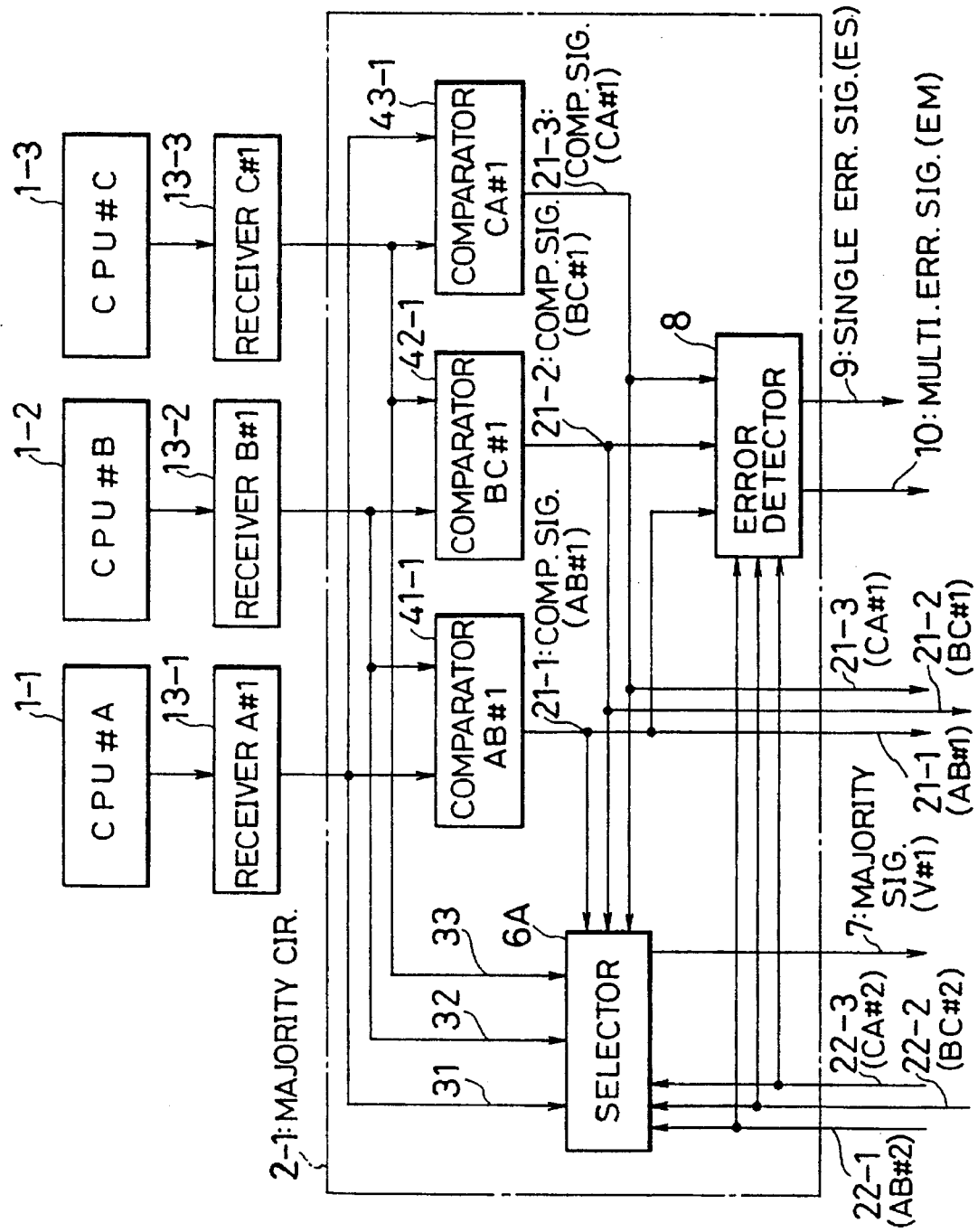
FIG. 14 is a block diagram which shows a general configuration of the majority circuit 2-1.

FIG. 14 shows a configuration of the majority circuit 2-1 of FIG. 13. The comparison signals 21-1–21-3, are output from the comparators 41-1–43-1 and transferred to majority circuit 2-2 of the other controller. In the same way, the majority circuit 2-2 outputs the comparison results as the comparison signals 2-1–22-3.

Figure 15:
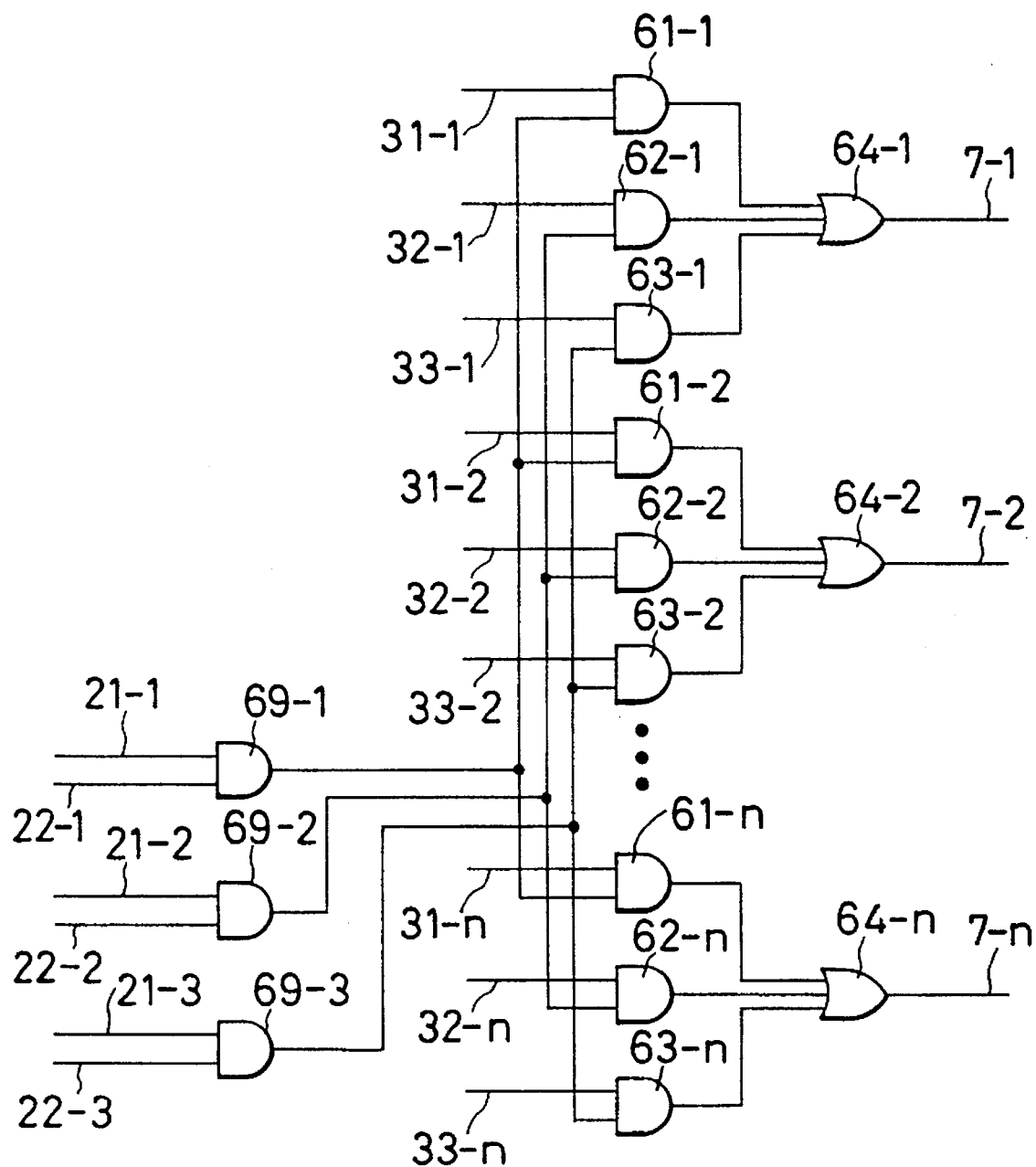
FIG. 15 shows a configuration of the selector 6A.

FIG. 15 shows a selector 6A of the majority circuit of FIG. 13. 2-input AND gates 69-1–69-3 are used in the selector 6A besides the configuration shown in FIG. 4. One input of each of the 2-input AND gates 69-1–69-3 is a respective comparison signal 21-1–21-3. The other input is a respective comparison signal 22-1–22-3. Majorities are determined by using the outputs from these 2-input AND gates 69-1–69-3 and are indicated by the majority signals 7-1–7-n.

FIG. 16 shows an operation of the majority circuit 2-1. This table especially shows the relation among the comparison signals 21-1–21-3, the comparison signals 22-1–22-3, the majority signals V#1–V#2, and estimated error location. In this figure, AB#1, BC#1, and CA#1 show the comparison signals of the majority circuit 2-1. AB#2, BC#2, and CA#2 show the comparison signals of the majority circuit 2-2. V#1 shows the majority signal of the majority circuit 2-1. V#2 shows the majority signal of the majority circuit 2-2.

The following is an operation of the controller configured as described above. An operation, especially of the selector, is explained using FIGS. 14, 15 in reference with FIG. 16.

The first line of FIG. 16 shows the case in which the comparison signals 21-1–21-3 and the comparison signals 22-1–22-3 are all "1". In this case, the input signals 31–33 of the processing units 1-1–1-3 are all normal. All of the 2-input AND gates 69-1–69-3 in the selector 6A output "1" and the input signal 31 of the processing unit 1-1 is output as the majority signals 7-1–7-n.

The second line of FIG. 16 shows the case in which the processing unit 1-1 is faulty and the comparator 41-1 is also faulty. In this case, each of the comparison signals 21-1, 21-2, 21-3 becomes "1", "1", "0" respectively. In case of the fault of the processing unit 1-1, the comparison signal 21-1 (AB#1) should become "0". But, in this case, the comparator 41-1 is also faulty, so that the comparison signal 21-1 is reversed to "1". Each of the comparison signals 22-1–22-3 become "0", "1", "0" because of the fault of the processing unit 1-1. Thus, the output of the 2-input AND gate 69-2 of the selector 6A becomes "1", and the input signal 32 of the processing unit 1-2 is output as the majority signals 7-1–7-n.

In the same way, the selector 6A can select the correct output of the processing unit and outputs it as the majority signal even in cases as follows: the case in which the processing unit 1-3 and the comparator 42-2 of the majority circuit 2-2 (BC#2) are faulty as shown in the third line of FIG. 16; and the case in which the processing unit 1-1 and the comparator 41-2 of the majority circuit 2-2 (AB#2) are faulty as shown in the fourth line of FIG. 16.

As described above, in this embodiment, the controller including the majority circuit is duplicated and the comparison signals of each comparator are exchanged mutually between two majority circuits.

The comparison signals of the duplicated majority circuits are ANDed. Therefore, the reliability of the comparator is increased, and an error of the comparator can be detected by the comparison signal of the other majority circuit. This detection prevents the selector from selecting the input signal of the faulty processing unit.

Embodiment 5.

Figure 17:
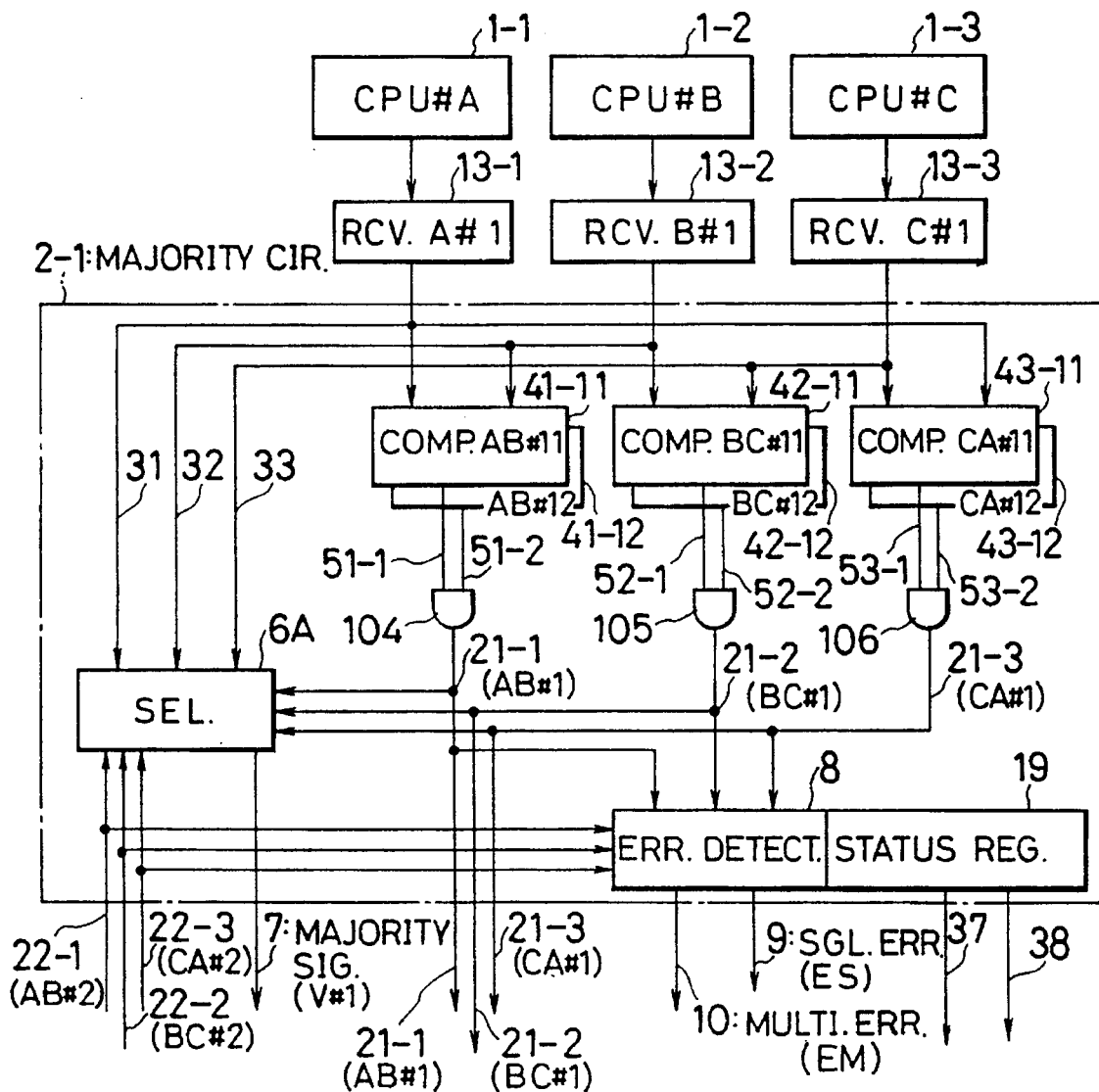
FIG. 17 is a block diagram which shows a general configuration of the majority circuit in Embodiment 5 of the invention.
Figure 32:
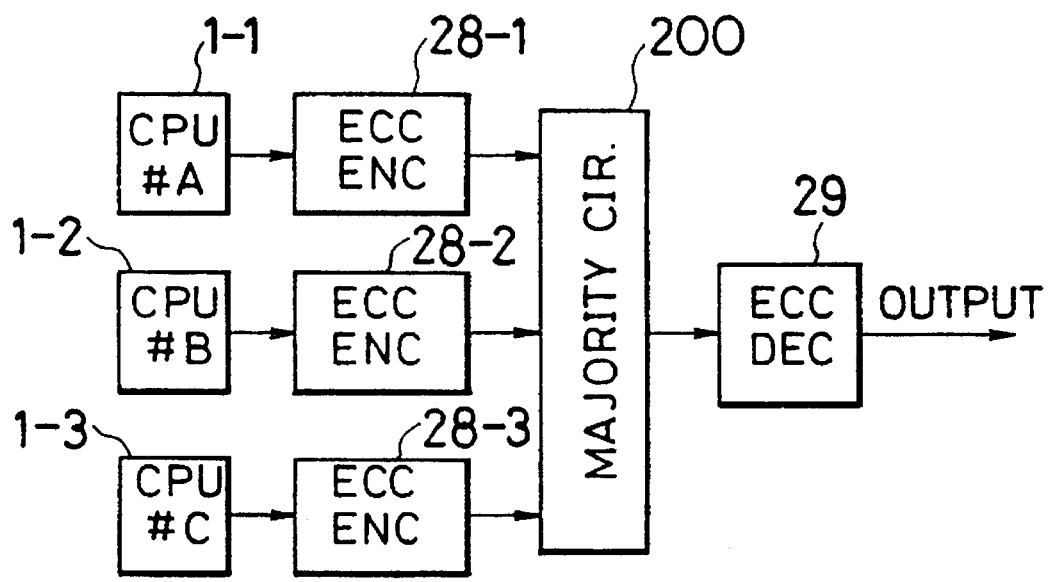
FIG. 32 shows an error correction of the conventional majority circuit.

FIG. 17 is a block diagram which shows a configuration of the majority circuit 2-1 of the controller in Embodiment 5 of the invention. The conventional majority circuit as shown in FIG. 32 includes the error correction code encoders 28-1–28-3 and the error correction code decoder 29. In the controller of this embodiment, the comparator in the majority circuit is duplicated and the comparison results are output via the 2-input AND gates 104–106. The comparison signals 21 and 22 are used for exchanging the information mutually with duplicated majority circuits 2-1 and 2-2. The comparison signals are registered in a status register 19 (a register means), and the controller generates an interrupt signal 37 to the processing unit based on the registered comparison results. The contents of the status register 19 may be read by the processing unit.

Figure 18:
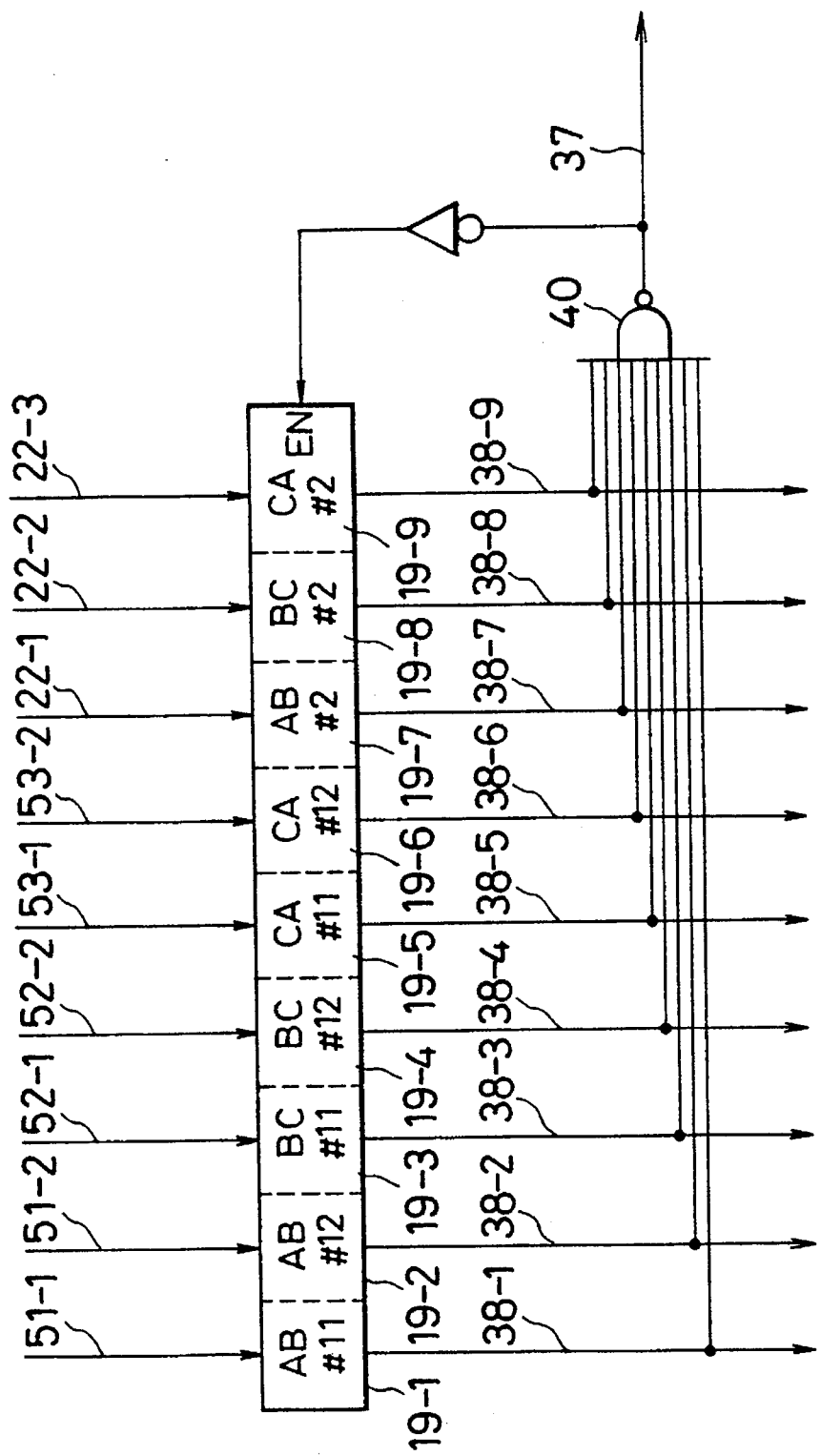
FIG. 18 shows a configuration of a status register 19.

FIG. 18 shows a configuration of the status register 19 of FIG. 17. The status register 19 comprises register elements 19-1–19-9, which are configured by flip-flops, etc. Each of the register elements 19-1–19-9 register each of the comparison signals 51-1, 51-2, 52-1, 52-2, 53-1, 53-2 of the comparators, 41-11, 41-12, 42-11, 42-12, 43-11, 43-12 of the majority circuit 2-1, and the comparison signals 22-1–22-3 of the majority circuit 2-2 respectively. A 9-input NAND gate 40 sets the interrupt signal 37 to "1" when "0" is registered in one of the above status registers.

FIG. 19 shows the error detection of the processing unit by checking the contents of the status register 19.

An operation of the majority circuit configured as described above is explained hereinafter in reference with FIGS. 17, 18 and 19. The operations of the comparators 41–43, the selector 6A and the error detector 8 are the same with the above embodiment and are not explained here for the sake of clarity.

In FIG. 17, the comparator is duplicated. Each output of the comparators is provided to the 2-input AND gates 104–106 and the final comparison signals 21-1–21-3 are provided to the selector 6A, the error detector 8, and the duplicated majority circuit 2-2 (refer to FIG. 13). In the same way, one of the duplicated majority circuit 2-2 outputs the comparison signals 22-1–22-3 to the other majority circuit 2-1. Thus, each of the comparison signals 21-1–21-3, 22-1–22-3 becomes "1" only when both comparison signals 51-1 and 51-2, both comparison signals 52-1 and 52-2, or both comparison signals 53-1 and 53-2 of the duplicated comparators are "1". Namely, the normal operations of both comparators are checked and can be guaranteed mutually.

In FIG. 18, the initial value of the flip-flops 19-1–19-9 in the status register 19 are all set to "1" by a reset signal (not shown in the figure). The initial value of the output signal of the 9-input AND gate 40, which is the interrupt signal 37, is "0". Therefore, enable signals EN of the flip-flops 19-1–19-9 are "1" and each of nine input signals to the flip-flops are outputted as each of the output signals 38-1–38-9. When one of nine input signals of the flip-flops becomes "0", the 9-input AND gate 40 outputs "1". And the interrupt signal 37 becomes "1" to generate an interruption to the processing units. In this case, the enable signals of the flip-flops become "0" to hold the status of the input signals at that time.

The processing units read the contents of the status register 19 by a status signal 38 when the interrupt signal is detected. And the processing units analyze the error location by a program.

In FIG. 19, the first line shows the status in which all of the comparison signals are "1". This means all operation of the processing units, the receivers, and the comparators are normal. The second line shows the status in which the comparison signals BC#11, BC#12 and BC#2 are "1" and the other signals are all "0". This case when analyzed indicates that the processing unit 1-1 (CPU#A) is faulty.

The third line shows the status in which the comparison signals 22-1–22-3 (AB#2, BC#2, CA#2) of the majority circuit 2-2 are all "1" and the comparison signals 51-1 (AB#11), 51-2 (AB#12), 53-1 (CA#11) and 53-2(CA#12) of the majority circuit 2-1 are all "0". This status does not mean a fault exists in the processing unit 1-1 (CPU#A). Rather, this, when analyzed, indicates that the receiver 13-1 (receiver A#1), which receives the output signal from the processing unit 1-1, is faulty.

In the same way, the fourth line shows the status in which the processing unit 1-3 (CPU#C) and the comparator 43-12 (CA#12) of the majority circuit 2-1 are faulty. After repairing the faulty element, the processing unit analyzes and checks the repaired element. When the repaired element is judged to be able to normally operate, the flip-flops 19-1–19-9 in the status register 19 are reset to the initial value "1" by the reset signal (not shown in the figure).

As described above, in this embodiment, the outputs of the duplicated comparators are ANDed, and the result is provided to the selector and the error detector as the comparison signal. The comparator is duplicated and two comparison signals are ANDed in this embodiment to improve the reliability of the majority circuit. In addition, an error of the comparator can be also detected by the comparison signal from the other comparator to prevent the selector from selecting the input signal of the faulty processing unit.

In this embodiment, the register is used for registering both of the comparison signals of its own controller and the other controller. When the mismatch of the comparison result is registered in the above register, an interrupt signal is generated to the processing units, so that the processing units read the contents of the register.

By this embodiment, errors of the processing unit and the receiver in the controller can be separately detected. An error location can be specified, so that repair time can be substantially reduced when the faulty element is exchanged or repaired.

Embodiment 6.

Figure 20:
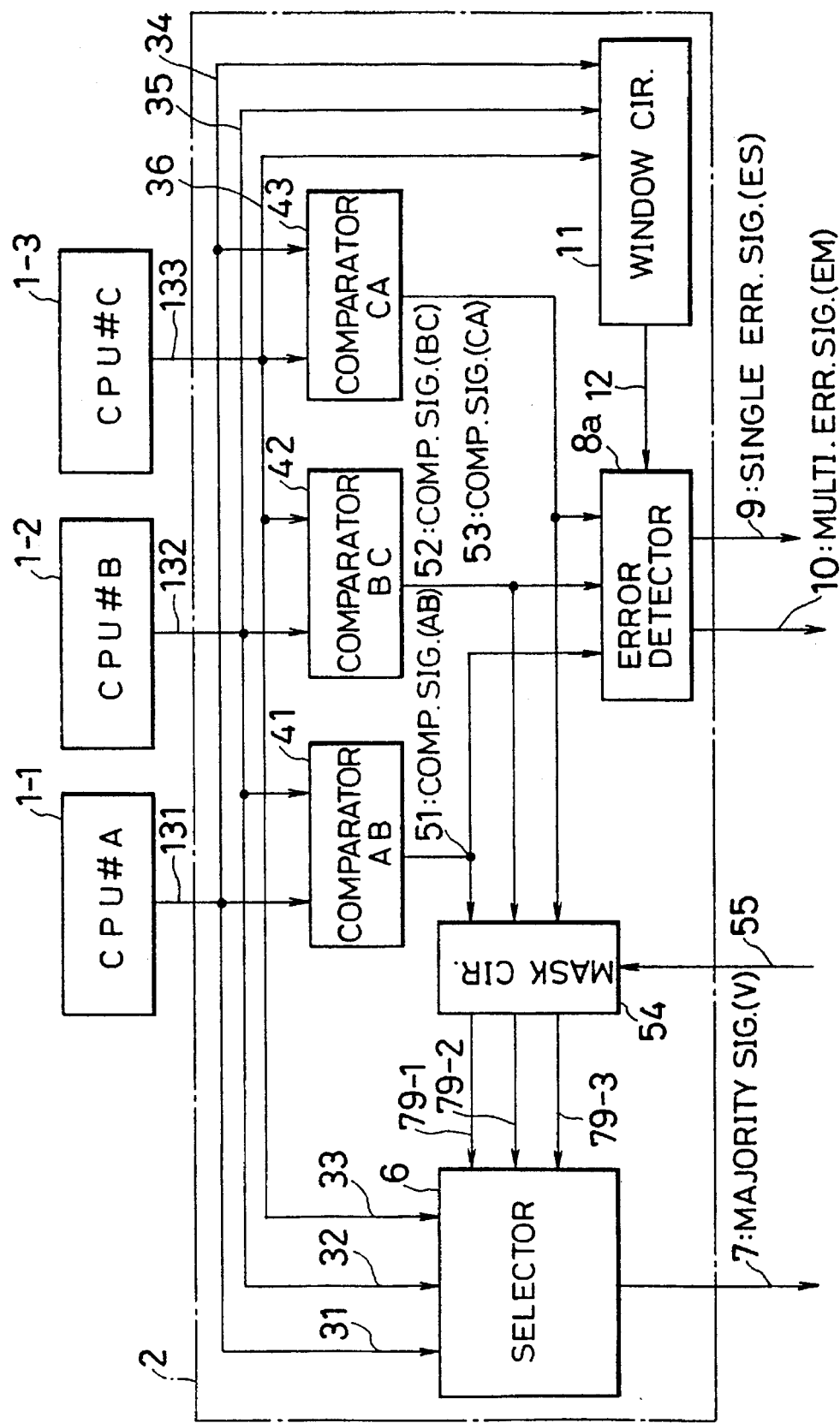
FIG. 20 is a block diagram which shows a general configuration of the majority circuit in Embodiment 6 of the invention.

FIG. 20 is a block diagram of the majority circuit in Embodiment 6 of the invention. Different aspects from the conventional majority circuits of Japanese Unexamined Patent No. SHO 57-36356 bulletin, and of Japanese Unexamined Patent No. HEI 1-126825 bulletin are as follows. A mask circuit 54 is included instead of the main system selector or the purging circuit and the comparison signals 51–53 are provided to the selector 6 through the mask circuit 54.

Figure 21:
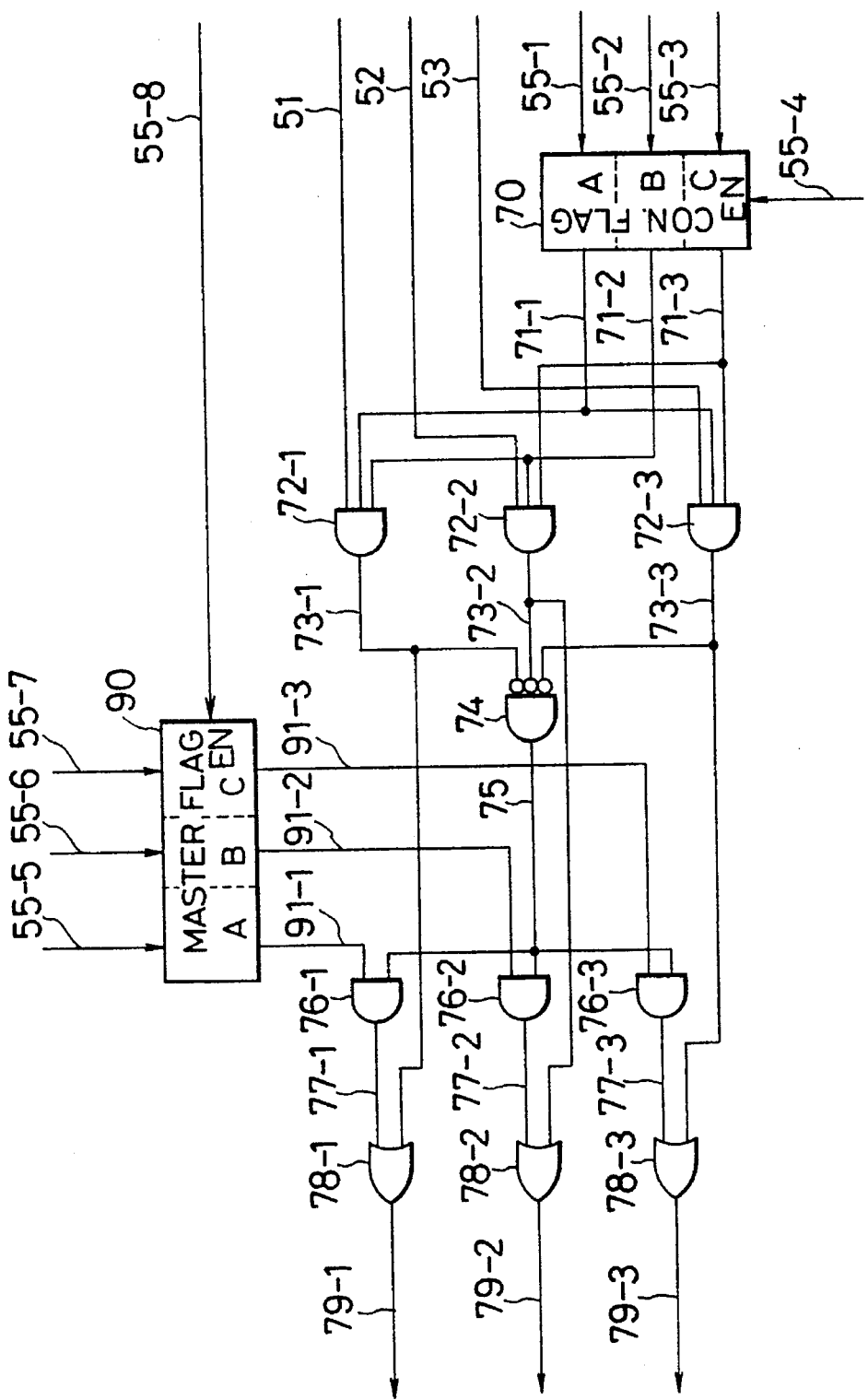
FIG. 21 shows a configuration of a mask circuit 54.

FIG. 21 shows a configuration of the mask circuit 54 of FIG. 20. A connection flag 70 indicates the processing unit to be connected. A master flag 90 selects an output of a specific processing unit when the comparison signals are all "0". The connection flag 70 and the master flag 90 are configured by register elements as flip-flops, etc. The connection flag 70 and the master flag 90 can set the contents based on a mask set signal 55, which is a control signal from the processing unit. The comparison signals 51–53 are converted by this mask circuit and are finally provided to the selector 6 as output signals 79-1–79-3.

The following is an operation of the majority circuit configured as described above in reference with FIGS. 20 and 21.

During normal operation, each flag of the connection flag 70 is set to "1" and each flag of the master flag 90 is set to "0". The comparison signals 51–53 are provided to the selector 6 as the output signals 79-1–79-3 via AND gates 72-1–72-3 and OR gates 78-1–78-3. Accordingly, the selector 6 operates in the same way with the above embodiment. In this status, the selector 6 selects one of the outputs of the processing units as long as one of the comparison signals 51–53 is "1".

When the comparison signals 51–53 are all "0", which means the outputs of three processing units are all different, an output signal 75 of a 3-input NOR gate 74 becomes "1". Thus, AND gates 76-1–76-3 output the contents of the master flag 90. The contents of the master flag 90 are output as the final output signals 79-1–79-3. As described above, when the contents of the master flag are set to "0", the output signals 79-1–79-3 become all "0". Thus, the selector outputs all "0", so that the operation is the same with the above embodiment.

The case in which one of bits of the master flag is previously set to "1" by a master flag write signal 55-8 with master flag set signals 55-5–55-7 is explained. For example, assume that the master flag B is previously set to "1". When the outputs of three processing units are all different, the output signal 75 of the 3-input NOR gate 74 becomes "1". When an output signal 91-2 is "1", an output signal 77-2 of the 2-input AND gate 76-2 becomes "1". Thus, an output signal 79-2 of the mask circuit becomes "1". Receiving the output signals from the mask circuit, the selector 6 selects the output of the processing unit 1-2 as the majority signal 7.

The following is an operation of the connection flag 70. The connection flag is provided for indicating subjects to carry out the majority among three processing units 1-1–1-3.

The contents of the connection flag are set with connection flag set signals 55-1–55-3 by a connection flag write signal 55-4 from the processing unit. For example, when a connection flag A of the connection flag 70 is set to "0" and a connection flag B and a connection flag C are set to "1", an output signal 71-1 of the connection flag A becomes "0", though the processing unit 1-1 is actually connected. In this case, the 3-input AND gates 72-1–72-3 control not to select the comparison signals 51 (AB), 53 (CA) to which the output of the processing unit 1-1 (CPU#A) is related.

In this embodiment, the mask circuit which can be set from the outside is comprised in the previous stage of the selector of the majority circuit and the connection flag and the master flag are comprised in this mask circuit. A processing unit can be separated from the majority signal processing by setting the corresponding bit of the connection flag to "0". An output of the specified processing unit can be selected by previously setting the master flag even when the outputs of three processing units are all different (in case of multiple errors). For example, a processing unit may be specified based on the error history using this feature. A possibility of selecting the processing unit supposed to be normal is improved even when two of three processing units are faulty and the system can continuously operate. In addition, the above feature may be obtained by a simple logic operation for the comparison results regardless of the numbers of the output bits of the processing unit, so that the size of the circuit can be reduced.

Embodiment 7.

Figure 22:
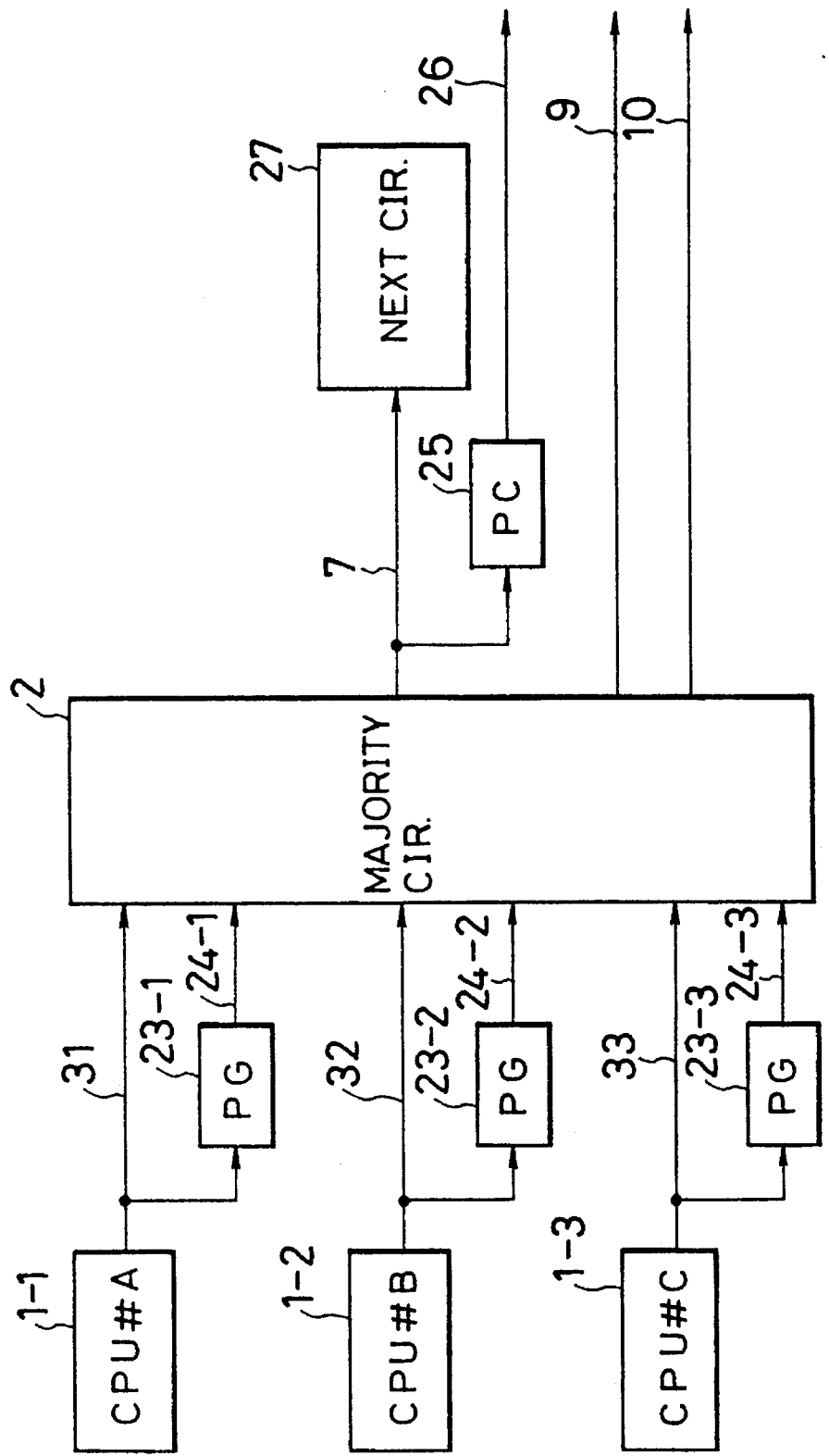
FIG. 22 shows the majority circuit with parity generators and checkers.
Figure 34:
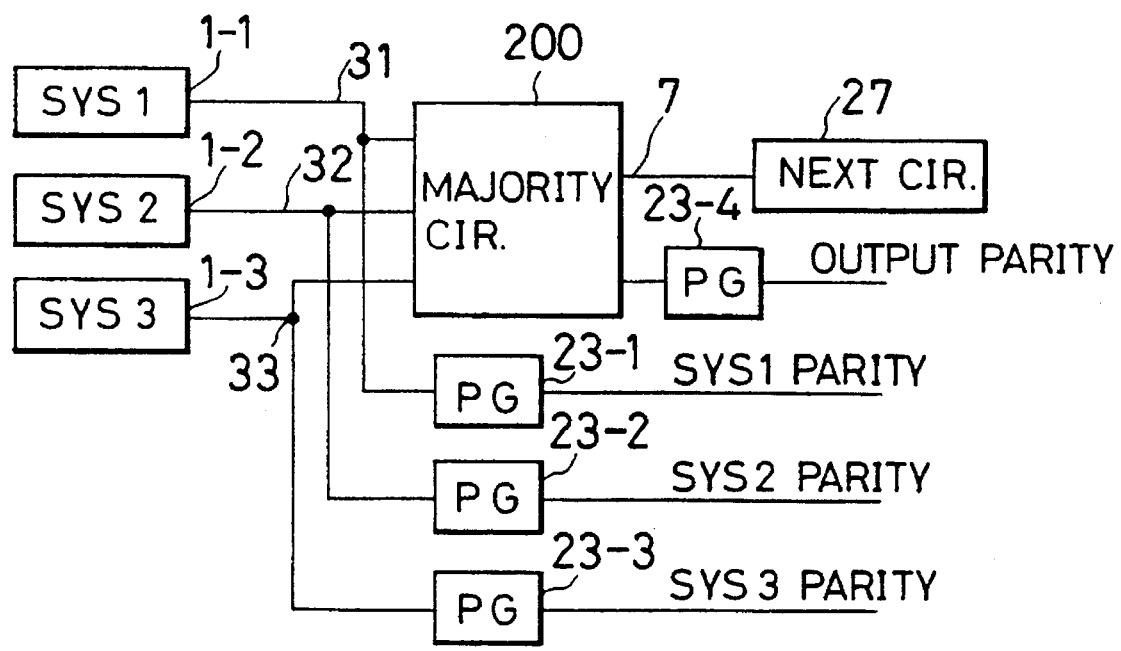
FIG. 34 shows an error detection of the conventional majority circuit.

FIG. 22 is a block diagram which shows a configuration for detecting an error of the majority circuit in Embodiment 7 of the invention. Different aspects from the conventional majority circuits shown in FIGS. 32 and 34 are the parity generators (a parity generate means) 23-1–23-3 and a parity check circuit 25 (a parity check means). The output signals 24-1–24-3 of the parity generators and the input signals 31–33 of the processing units 1-1–1-3 are input to the majority circuit 2. The parity check circuit 25 (the parity check means) checks the output signal 7 from the majority circuit 2. The output signal 7 including a parity bit is provided to the next circuit.

The following is an explanation of the operation shown in FIG. 22. The input signals 31–33 of the processing units 1-1–1-3 are input to the majority circuit 2 and the parity generators 23-1–23-3. The parity generators 23-1–23-3 generate parity bits 24-1–24-3 based on the input signals 31–33 of the processing units 1-1–1-3, and the parity bits are input to the majority circuit 2. The majority circuit carries out majority processing of the input signals, including the parity bits, and outputs the majority signal 7. In this case, for example, assume that the selector 6 becomes faulty and generates an error. The parity check circuit 25 checks the output of the majority circuit 7 with parity and sets an error signal 26 to "1". Thus, an error of the majority circuit 2 can be detected.

As described above, in this embodiment, the parity generator is used for generating and appending a parity bit to the output of the processing unit. The majority circuit then selects the normal output from the processing units, including the outputs of the parity generators. And the parity check circuit is used for checking the normal operation of the majority circuit. The signals, including the parity information, may be provided to the next control circuit to the majority circuit.

In this embodiment, the parity generator generates and appends the parity bit to the output of the processing unit. The outputs of the processing units, including the parity bits, are input to the majority circuit. The output of the selector of the majority circuit is checked by the parity check circuit. Thus, an error of the comparator and the selector in the majority circuit can be detected. Furthermore, the information including the parity bit is output to the next control circuit to the selector. Also, in the control circuit of the next stage, the information including the parity bit can be used as an error check signal.

Embodiment 8.

Figure 23:
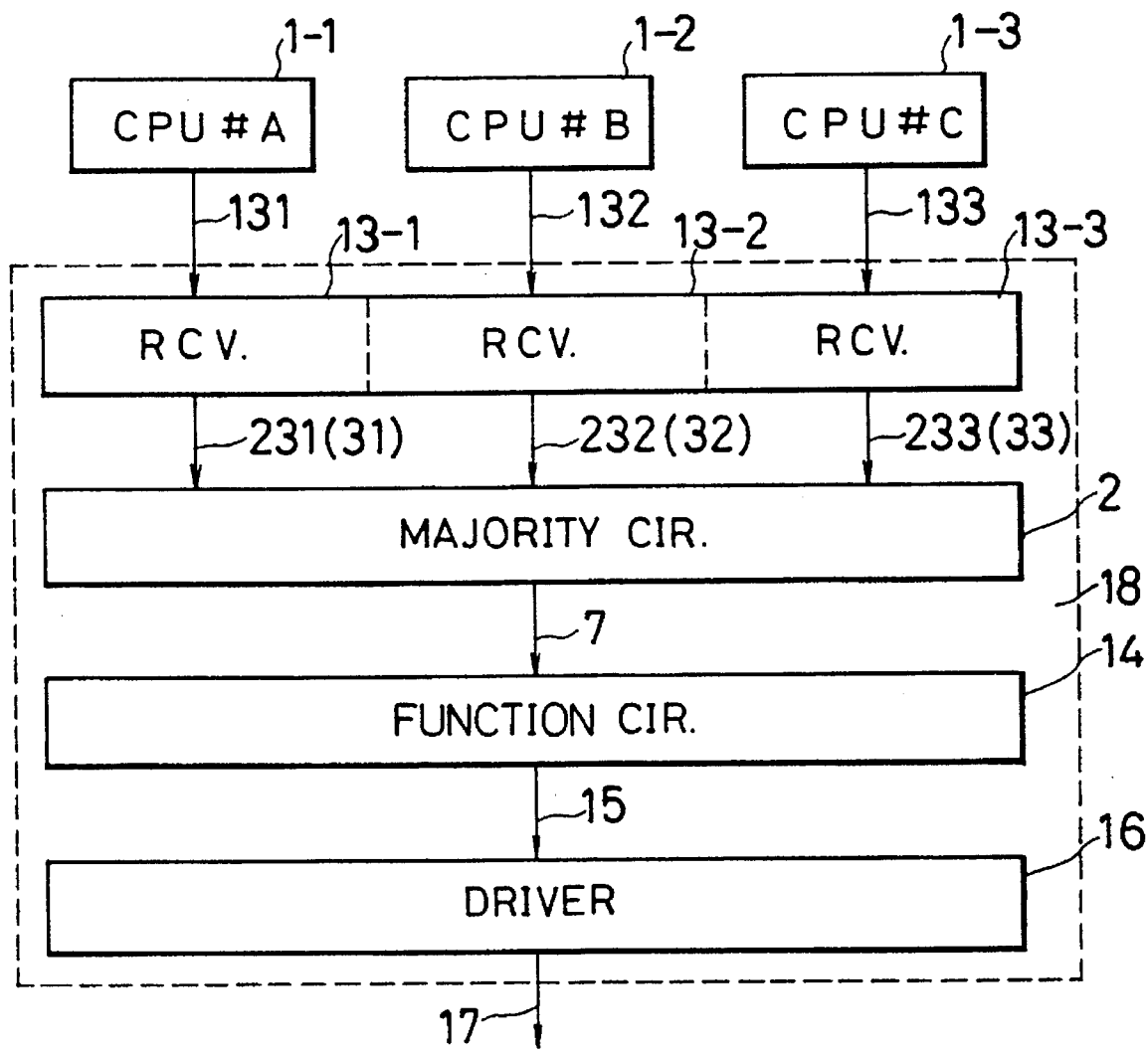
FIG. 23 shows the majority circuit located in a controller in Embodiment 8 of the invention.

FIG. 23 is a block diagram which shows a general configuration of the controller in Embodiment 8 of the invention. For clarity sake, the same signs are used for the elements common with the conventional art shown in FIG. 30.

Different aspects from the conventional majority circuit shown in FIG. 30 are that the majority circuit 2 is located in the controller, output signals 131–133 of the processing units 1-1–1-3 are provided to the majority circuit 2 through the receiver 13-1–13-3, and the majority signal 7 of the majority circuit 2 is provided to the function circuit 14.

The following is an operation of the controller configured as described above in reference with FIG. 23. Output signals 131–133 of the processing units 1-1–1-3 are input to the receivers 13-1–13-3. The receivers output signals 231–233, which become the input signals 31–33 to the majority circuit 2. The operation of the majority circuit is the same with the above embodiment and it is not explained here.

When all of the processing units 1-1–1-3 execute the same instruction, all of the output signals 131–133 become the same. In case of a fault of the receiver, for example, when the receiver 13-1 is faulty, the input signal 31 becomes different from the output signal 131 of the processing unit 1-1. But the majority circuit 2 selects the output signal 132 of the processing unit 1-2 as the majority signal 7 and outputs it to the function circuit 14. Namely, the correct output of the processing unit through the receiver can be provided to the function circuit 14, even if a receiver is faulty.

As described above, in this embodiment, plural receivers are used in the controller to connect to the processing units. And the majority circuit is used in the stage next to the receiver. The normal output can be selected from the outputs of the processing units and the receivers of the controller.

In this embodiment, majority of the outputs of the processing units and the receivers of the controller can be carried out since the majority circuit is located in the controller.

Embodiment 9.

Figure 24:
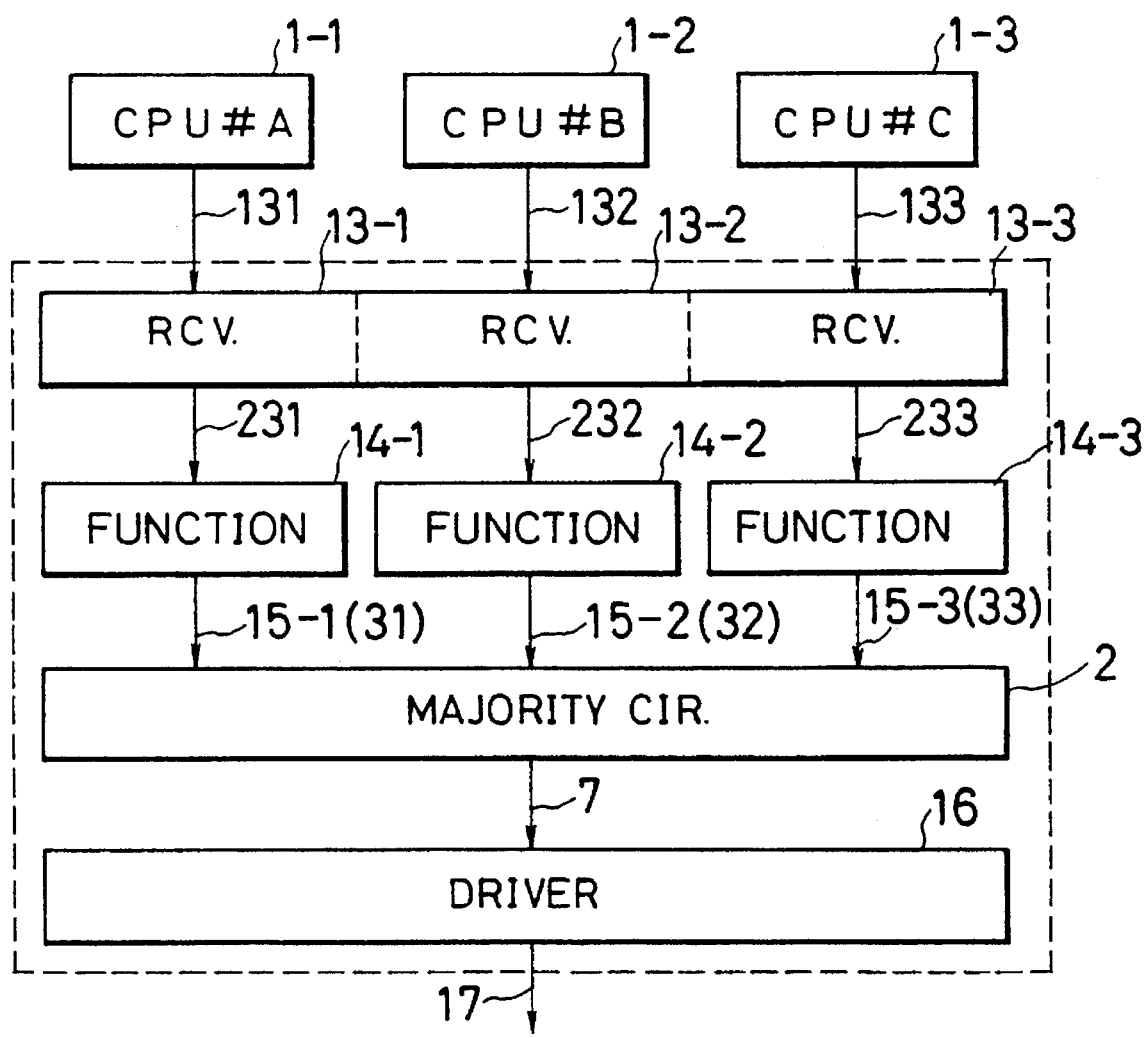
FIG. 24 shows the triplicated function circuit in the controller in Embodiment 9 of the invention.

FIG. 24 is a block chart which shows a whole configuration of the controller in Embodiment 9 of the invention. The same signs are used for the common elements with the conventional technique shown in FIG. 30, for clarity sake.

The followings are different aspects from the conventional majority circuit shown in FIG. 30. The majority circuit 2 is located in the controller. The output signals 131–133 of the processing units 1-1–1-3 are provided to the triplicated function circuits 14-1–14-3 through the receivers 13-1–13-3. Output signals 15-1–15-3 of the function circuits 14-1–14-3 are provided to the majority circuit 2, and the majority signal 7 of the majority circuit 2 is output through the driver 16.

An operation of the controller configured as described above is explained in reference with FIG. 24. The output signals 131–133 of the processing units 1-1–1-3 are input to the receivers 13-1–13-3. The receivers output the signals 231–233 to the function circuits 14-1–14-3. The function circuit generates a signal to execute a desired feature, for example, a signal to access a main memory (not illustrated). The output signals 15-1–15-3 are input to the majority circuit 2 as the input signals 31–33. The operation of the majority circuit is the same with the above embodiment and is not explained here.

When the processing units 1-1–1-3 execute the same instruction, all of the output signals 131–133 become the same. These same signals are provided to the function circuits through the receivers. If one of the function circuits, for example, the function circuit 14-1 is faulty, the output of the function circuit 14-1 becomes different from the signals of the other two function circuits 14-2 and 14-3. But the majority circuit 2 selects the correct output from the output signals of the function circuits 14-1–14-3, that is, one of two equal outputs of the function circuits 14-2 and 14-3, and outputs it as the majority signal 7. Accordingly, the correct output can be obtained even if one of the processing units 1-1–1-3, the receivers 13-1–13-3, and the function circuits 14-1–14-3 is faulty.

As described above, in this embodiment, the function circuit in the controller connected next to the processing unit is triplicated and the majority circuit is located at the next stage of the function circuit. And the majority circuit selects the normal output from the processing units, the receivers and the function circuits of the controller.

In this embodiment, the function circuit in the controller is triplicated and the majority circuits are located next to the function circuits. Majority of the outputs of the processing units, the receivers and the function circuits of the controller can be carried out so that the reliability of the function circuits can be improved.

Embodiment 10.

Figure 25:
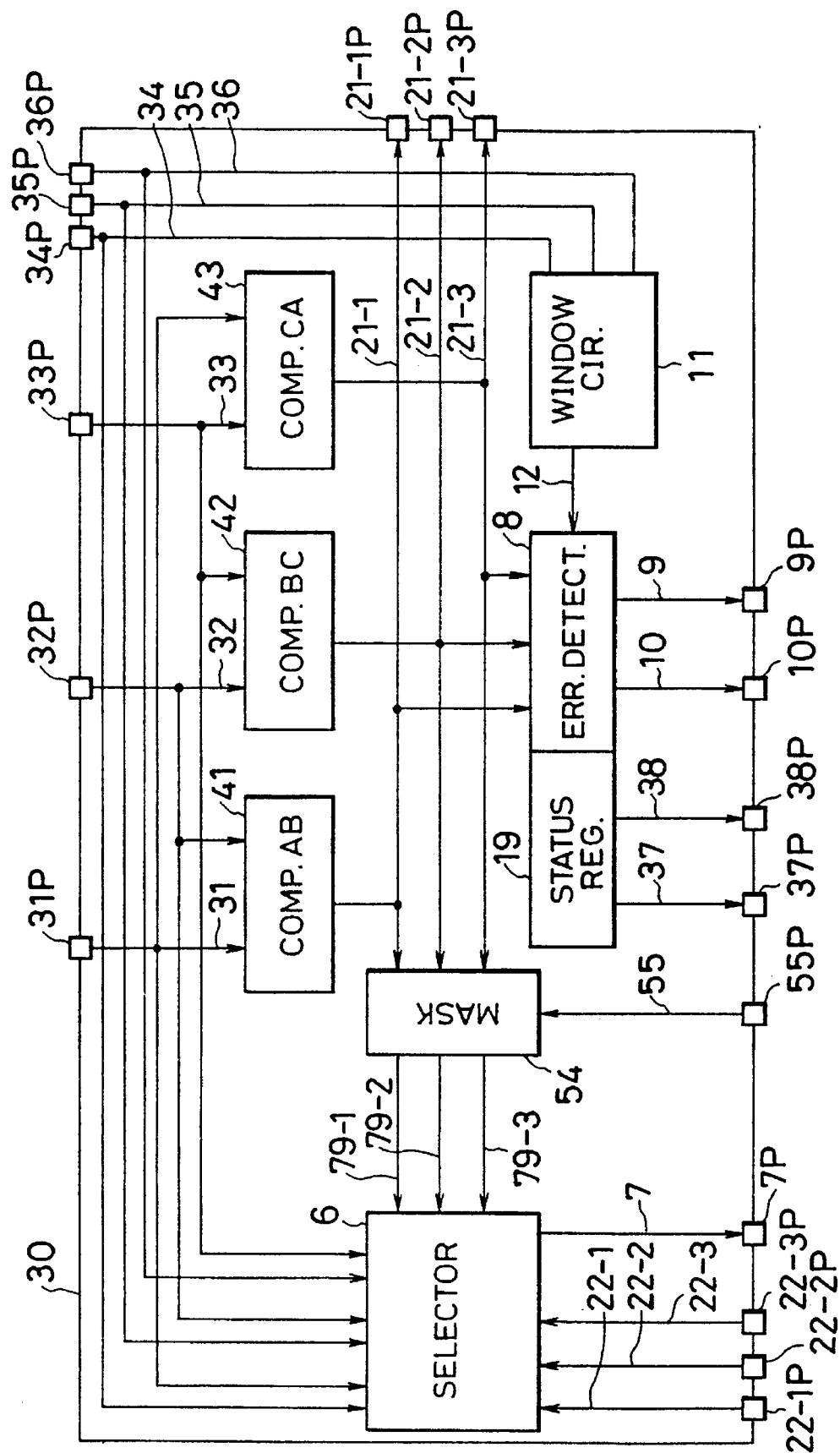
FIG. 25 is a block diagram which shows a general configuration of the majority LSI in Embodiment 10 of the invention.

FIG. 25 is a block diagram which shows a configuration of majority LSI (semiconductor integrated circuit) in Embodiment 10 of the invention. For clarity sake, the same signs are used for the elements common with the above embodiments.

The majority LSI 30 includes various kinds of input/ output pins as follows:

a plurality of general purpose input pins 31P–33P for inputting the subjects to carry out the majority, a general purpose output pin 7P for outputting the majority signal, control input pins 34P–36P which show the validity of the signal from the general purpose input pins 31P–33P, a set signal input pin 55P for setting the mask circuit, comparison result output pins 21-1P–21-3P for outputting the comparison result to outside, comparison result input pins 22-1P–22-3P for inputting the comparison result from outside, a single error signal output pin 9P for outputting single error status of three processing units, a multiple error signal output pin 10P for outputting multiple error status of the processing units, an interrupt signal output pin 37P for outputting an interruption to outside when one of the comparison results has an error, and a status output pin 38P for outputting the comparison result registered. In addition, the majority LSI includes the comparators 41–43, the selector 6, the error detector 8, the window circuit 11, the mask circuit 54, and the status register 19 which are connected to the above input/output pins.

Figure 26:
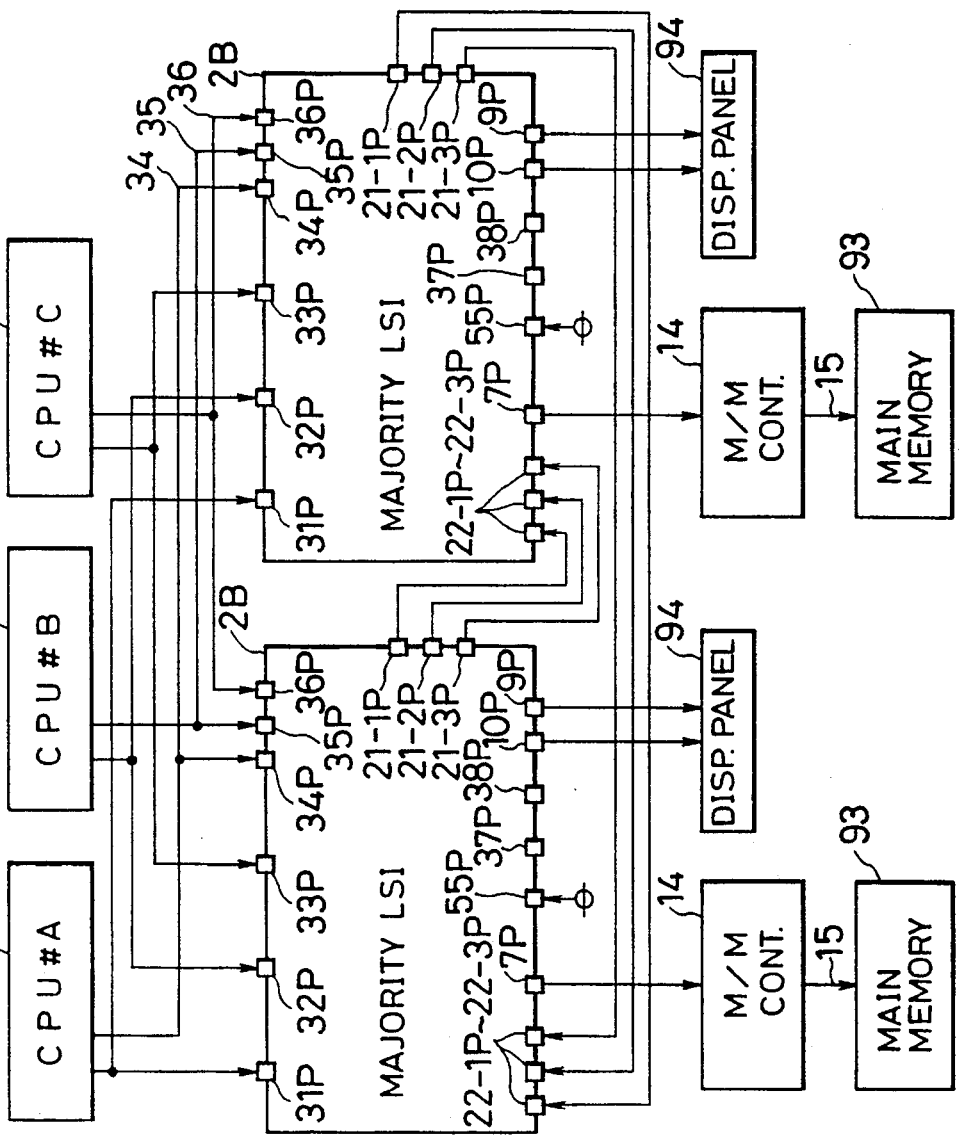
FIG. 26 shows a practical application of the LSI for majority.

FIG. 26 shows an example of practical application of the majority LSI shown in FIG. 25. Three processing units 1-1–1-3 are connected to the general purpose input pins 31P–33P and the control input pins 34P–36P of the duplicated majority LSI. Between the duplicated majority LSIs, each of the comparison result output pins 21-1P–22-3P and each of the comparison result output pins 22-1P–22-3P are connected respectively. The general purpose output pin 7P is connected to the main memory controller and the output signal 15 of the main memory controller is outputted to the main memory. The single error signal output pin 9P and the multiple error signal output pin 10P are connected to a display panel 94. The level of the set signal input pin 55P is set to "1", and the interrupt signal output pin 37P and the status output pin 38P are not used in this example.

An operation of the majority LSI configured as described above is the same with the majority circuit in the above embodiments and it is not explained here. The following is an operation of the practical application shown in FIG. 26.

Three processing units 1-1–1-3 execute the same instruction at the same timing and these outputs are provided to the main memory controller through the majority LSI. Since the majority circuit is highly reliable as explained above, the correct signal can be always provided to the main memory controller 14 and the correct data can be written on the main memory 93 even if one of three processing units is faulty.

The majority LSI is duplicated and the comparison results of the comparators are exchanged mutually to improve the ability of detecting and analyzing an error. Furthermore, the display panel, which is connected to the single error signal output pin 9P and the multiple error signal output pin 10P, displays the error status.

In this embodiment, the semiconductor integrated majority circuit having the following features has been explained. The semiconductor integrated majority circuit includes a plurality of general purpose input pins for receiving input signals subjecting to the majority, the selector for selecting and outputting one of input signals received from the general purpose input pins based on the comparison result of the comparator, and the general purpose output pin for outputting the output signal from the selector as the majority signal of the input signals received from the general purpose input pin. And the semiconductor integrated majority circuit also includes the error detector for detecting an error status of the input signal based on the comparison result of the comparator and the single error signal output pin and the multiple error signal output pin for outputting the error detection result of the error detector.

The semiconductor integrated majority circuit of this embodiment also includes the control signal input pin which inputs a control signal having specific meaning to the input signal, and the window circuit which generates the signal for preventing the output of the error signal from the error detector.

The semiconductor integrated majority circuit of this embodiment also includes the mask circuit which masks the comparison result of the comparator and outputs the selected information and includes the set signal input pin for setting the mask information of the mask circuit.

The semiconductor integrated majority circuit of this embodiment also includes the comparison result output pin for outputting the comparison result of the comparator to the outside, and the comparison result input pin for inputting the comparison result of the comparator of the other semiconductor integrated majority circuit. The comparator selects one of the inputs of the general purpose input pin based on both comparison results.

As described above, in the majority circuit of this embodiment, the mask circuit can be set from the outside and located in the previous stage of the selector. The mask circuit masks the comparison signal of the comparator used for selecting the output of the processing unit.

The mask circuit of the majority circuit of this embodiment includes the connection flag for controlling the connection and the disconnection of the processing unit and the master flag for indicating a specific processing unit to be selected in case of a multiple error of the processing unit or a fault of the comparator.

The semiconductor integrated majority circuit of this embodiment includes the register circuit for registering the signal to the comparison result output pin and from the comparison result input pin, the interrupt signal output pin which generates an interrupt signal to the outside when a specific information is written in the register circuit, and the status output pin for outputting the information registered in the register circuit to the outside.

The highly reliable majority circuit as described in the above embodiments is implemented to the majority LSI as a single chip. The general purpose input/output pins, the control pins are provided for connecting various kinds of processing units. Pins to be used can be selected optionally depending on various kinds of purposes. The duplicated system can be built easily and with a low cost using two majority LSIs.

The present invention has been described in connection with a number of specific embodiments thereof. Numerous extensions, modifications, and variations obvious to those skills in the art are also contemplated by the invention. Thus, the above description is given by way of example, only, and the present invention is not to be limited thereby, but to be limited only by the scope of the appended claims.

What is claimed is:

1. A majority circuit for receiving X (X>=3) number of n-bit (n>=2) signals from X number of systems and for outputting one of the n-bit signals as a majority signal, the majority circuit comprising:

(a) compare means for receiving the X number of n-bit signals as input signals, the compare means including means for making a plurality of unique signal combinations, each combination being of Y (X>Y>=2) number of the input signals and being a comparison between Y number distinct input signals;

(b) select means for receiving the X number of input signals and for selecting one input signal as the majority signal based on a comparison result of the compare means;

(c) error recognition means connected to receive the comparison result from the compare means, for recognizing an existence of a faulty system among X number of systems based on the comparison result of the compare means, wherein each of the n-bit signals includes a binary strobe signal which indicates the validity of the n-bit signal; and (d) window means for receiving the binary strobe signals and generating an error check signal which prohibits error recognition in the error recognition means.

2. The majority circuit of claim 1, further comprising receive means for receiving a comparison result of another majority circuit and generating a new comparison result based on both of the comparison result and the comparison result of another majority circuit.

3. The majority circuit of claim 1, wherein the majority circuit has a plurality of the compare means and generates the comparison result based on the plurality of the compare means.

4. The majority circuit of claim 2 or 3, further comprising:

register means for registering the comparison result; and interrupt means for generating an interrupt to the systems based on the comparison result registered by the register means.

5. The majority circuit of claim 1, further comprising code generate means for generating a check code for checking an error of the n-bit signal and appends the check code to the input signal, wherein the compare means compares the input signals, including the check code, and the select means selects the majority signal, including the check code, and the majority circuit further comprising check means for checking the majority signal based on the check code included in the majority signal.

6. The majority circuit of claim 1, wherein the majority circuit is formed on a single integrated chip.

7. A majority circuit for receiving X (X>=3) number of n-bit (n>=2) signals from X number of systems and for outputting one of the n-bit signals as a majority signal, the majority circuit comprising:

(a) compare means for receiving the X number of n-bit signals as input signals, the compare means including means for making a plurality of unique signal combinations, each combination being of Y (X>Y>=2) number of the input signals and being a comparison between Y number distinct input signals;

(b) select means for receiving the X number of input signals and for selecting one input signal as the majority signal based on a comparison result of the compare means; and (c) a next circuit connected to receive the majority signal; and wherein the select means has level set means for setting a level of the majority signal to a specific level based on the comparison result of the compare means so that the majority signal does not give any influence to the next circuit which receives the majority signal.

8. A controller for receiving X (X>=3) number of input signals from X number of systems and outputting one of the input signals as a majority signal to a next circuit, the controller comprising:

(a) X (X>=3) number of receivers for receiving X number of signals from X number of systems respectively; and (b) a majority circuit comprising:

(b1) compare means for receiving the X number of n-bit signals from X number of receivers as input signals, the compare means including means for making a plurality of unique signal combinations, each combination being of Y (X>Y>=2) number of the input signals and being a comparison between Y number distinct input signals;

(b2) select means for receiving the X number of input signals and for selecting one input signal as the majority signal based on a comparison result of the compare means; and (c) a next circuit connected to receive the majority signal, and wherein the select means has level set means for setting a level of the majority signal to a specific level based on the comparison result of the compare means so that the majority signal does not give any influence to the next circuit which receives the majority signal.

9. A controller for receiving X (X>=3) number of input signals from X number of systems and outputting one of the input signals as a majority signal to a next circuit, comprising:

(a) X number of feature circuits for receiving X number of signals from X number of systems respectively and performing a predefined feature therein;

(b) a majority circuit comprising:

(b1) compare means for receiving the X number of n-bit signals from X number of features as input signals, the compare means including means for making a plurality of unique signal combinations, each combination being of Y (X>Y>=2) number of the input signals and being a comparison of Y number of the input signals; and (b2) select means for receiving the X number of input signals and for selecting one input signal as the majority signal based on a comparison result of the compare means; and (c) a next circuit connected to receive the majority signal, and wherein the select means has level set means for setting a level of the majority signal to a specific level based on the comparison result of the compare means so that the majority signal does not give any influence to the next circuit which receives the majority signal.

10. A majority circuit for receiving at least three n-bit signals and for outputting one of the n-bit signals as a majority signal, the majority circuit comprising:

a plurality of comparators connected to receive a corresponding plurality of unique sets of the n-bit signals and forming comparison outputs;

a selector connected to receive as inputs the n-bit signals and as control signals the comparison outputs, whereby one of the n-bit signals is selected as a majority signal; and an error detector connected to receive the comparison outputs and producing a signal denoting single errors and producing a signal denoting multiple errors;

wherein each of the n-bit signals includes a binary strobe signal which indicates the validity of the n-bit signal, the majority circuit further comprising window means for receiving the binary strobe signals and generating an error check signal which controls the error recognition in the error detector.

11. A majority circuit for receiving at least three n-bit signals and for outputting one of the n-bit signals as a majority signal, the majority circuit comprising:

a plurality of comparators connected to receive a corresponding plurality of unique sets of the n-bit signals and forming comparison outputs;

a selector connected to receive as inputs the n-bit signals and as control signals the comparison outputs, whereby one of the n-bit signals is selected as a majority signal; and an error detector connected to receive the comparison outputs and producing a signal denoting single errors and producing a signal denoting multiple errors;

further including a next circuit connected to receive the majority signal, and wherein the selector has level set means for setting a level of the majority signal to a specific level based on the comparison result of the plurality of comparators so that the majority signal does not give any influence to the next circuit which receives the majority signal.

12. A majority circuit for receiving at least three n-bit signals and for outputting one of the n-bit signals as a majority signal, the majority circuit comprising:

a plurality of comparators connected to receive a corresponding plurality of unique sets of the n-bit signals and forming comparison outputs;

a selector connected to receive as inputs the n-bit signals and as control signals the comparison outputs, whereby one of the n-bit signals is selected as a majority signal;

an error detector connected to receive the comparison outputs and producing a signal denoting single errors and producing a signal denoting multiple errors; and mask means, located between the plurality of comparators and the selector, for masking the comparison outputs from the plurality of comparators.

13. The majority circuit of claim 12, wherein the three n-bit signals are produced by three distinct processor systems, and wherein the mask means includes means for giving preference to one of the three processor systems by masking out all but an input signal of the one processor system.

14. A majority circuit for receiving at least three n-bit signals and for outputting one of the n-bit signals as a majority signal, the majority circuit comprising:

a plurality of comparators connected to receive a corresponding plurality of unique sets of the n-bit signals and forming comparison outputs;

a selector connected to receive as inputs the n-bit signals and as control signals the comparison outputs, whereby one of the n-bit signals is selected as a majority signal;

an error detector connected to receive the comparison outputs and producing a signal denoting single errors and producing a signal denoting multiple errors; and code generator means for generating a check code for checking an error of each n-bit signal and appends the check code to each n-bit signal;

wherein the plurality of comparators compare the n-bit signals, including the check code, and the selector selects the majority signal, including the check code, and the majority circuit further comprising check means for checking the majority signal based on the check code included in the majority signal.

15. A majority circuit for receiving X (X>=3) number of n-bit (n>=2) signals from X number of systems and for outputting one of the n-bit signals as a majority signal, the majority circuit comprising:

(a) compare means for receiving the X number of n-bit signals as input signals, the compare means including means for making a plurality of unique signal combinations, each combination being of Y (X>Y>=2) number of the input signals and being a comparison between Y number distinct input signals;

(b) select means for receiving the X number of input signals and for selecting one input signal as the majority signal based on a comparison result of the compare means; and (c) mask means, located between the compare means and the select means, for giving preference to a specific system by masking out all but an n-bit signal from the specific system, wherein the mask means includes a master flag memory for storing a master flag which indicates the specific system, a circuit for detecting multiple errors based on the comparison result of the compare means and for outputting the master flag to the select means as the comparison result when the multiple errors are detected.

16. The majority circuit of claim 15, wherein the mask means further includes a connection flag memory for storing a connection flag which indicates a specific system to be masked.

* * * * *